United States Patent
Nunan et al.

(10) Patent No.: US 7,304,302 B1
(45) Date of Patent: Dec. 4, 2007

(54) SYSTEMS CONFIGURED TO REDUCE DISTORTION OF A RESIST DURING A METROLOGY PROCESS AND SYSTEMS AND METHODS FOR REDUCING ALTERATION OF A SPECIMEN DURING ANALYSIS

(75) Inventors: Peter Nunan, Monte Sereno, CA (US); Muhran Nasser-Ghodsi, Hamilton, MA (US); Mark Borowicz, San Jose, CA (US); Rudy F. Garcia, Union City, CA (US); Tzu Chin Chuang, Cupertino, CA (US); Herschel Marchman, San Jose, CA (US); David Soltz, San Jose, CA (US)

(73) Assignee: KLA-Tencor Technologies Corp., Milpitas, CA (US)

( * ) Notice: Subject to any disclaimer, the term of this patent is extended or adjusted under 35 U.S.C. 154(b) by 275 days.

(21) Appl. No.: 11/215,745

(22) Filed: Aug. 29, 2005

Related U.S. Application Data

(60) Provisional application No. 60/605,119, filed on Aug. 27, 2004.

(51) Int. Cl.
*H01J 37/21* (2006.01)
(52) U.S. Cl. .................. 250/311; 250/443.1; 250/397; 250/306; 250/310; 356/36
(58) Field of Classification Search ................. None
See application file for complete search history.

(56) References Cited

U.S. PATENT DOCUMENTS 6,514,866 B2   2/2003   Russell et al.
6,651,226 B2   11/2003  Houge et al.
6,730,237 B2   5/2004   Sievers et al.
6,745,575 B2   6/2004   Butcher (Continued)

FOREIGN PATENT DOCUMENTS

JP    8-222175      8/1996
JP    2001-319923   11/2001

OTHER PUBLICATIONS

Hoffman et al., "Investigation of 193 nm Resist Shrinkage During CD-SEM Measurement," Yield Management Solutions, 2001, pp. 32-36.

*Primary Examiner*—Jack I. Berman
*Assistant Examiner*—Zia R. Hashmi
(74) *Attorney, Agent, or Firm*—Baker & McKenzie LLP

(57) ABSTRACT

Various systems configured to reduce distortion of a resist during a metrology process are provided. The systems include an electron beam metrology tool configured to measure one or more characteristics of one or more resist features formed on a specimen. The electron beam metrology tool may be configured as a scanning electron microscope. The resist may be designed for exposure at a wavelength of about 193 nm. One system includes a cooling subsystem configured to alter a temperature of the specimen during measurements by the tool such that the resist feature(s) are not substantially distorted during the measurements. Another system includes a drying subsystem that is configured to reduce moisture proximate the specimen during measurements by the electron beam metrology tool such that the resist feature(s) are not substantially distorted during the measurements. An additional system may include both the cooling subsystem and the drying subsystem.

46 Claims, 6 Drawing Sheets

U.S. PATENT DOCUMENTS

| | | |
|---|---|---|
| 6,748,747 B2 | 6/2004 | Hoschek |
| 6,787,783 B2 | 9/2004 | Marchman et al. |
| 6,843,927 B2 | 1/2005 | Nasser-Ghodsi |
| 6,921,722 B2 | 7/2005 | Ogure et al. |
| 6,943,350 B2 | 9/2005 | Nasser-Ghodsi et al. |
| 7,190,441 B1 * | 3/2007 | McWhirter et al. ........... 356/36 |
| 2003/0132197 A1 | 7/2003 | Ke et al. |

* cited by examiner

SYSTEMS CONFIGURED TO REDUCE DISTORTION OF A RESIST DURING A METROLOGY PROCESS AND SYSTEMS AND METHODS FOR REDUCING ALTERATION OF A SPECIMEN DURING ANALYSIS

PRIORITY CLAIM

This application claims priority to U.S. Provisional Application No. 60/605,119 entitled "Systems Configured to Reduce Distortion of a Resist During a Metrology Process," filed Aug. 27, 2004, which is incorporated by reference as if fully set forth herein.

BACKGROUND OF THE INVENTION

1. Field of the Invention

The present invention generally relates to systems configured to reduce distortion of a resist during a metrology process. Certain embodiments relate to a system that includes a cooling subsystem and/or a drying subsystem coupled to an electron beam metrology tool.

2. Description of the Related Art

The following description and examples are not admitted to be prior art by virtue of their inclusion in this section.

Fabricating semiconductor devices such as logic and memory devices typically includes processing a substrate such as a semiconductor wafer using a number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polish, etch, deposition, and ion implantation. Multiple semiconductor devices may be fabricated in an arrangement on a semiconductor wafer and then separated into individual semiconductor devices.

As the dimensions of semiconductor devices shrink, metrology processes used to measure characteristics of the semiconductor devices become increasingly important. For instance, the acceptable variation in the characteristics of the features of the semiconductor devices (e.g., critical dimension, "CD") also decreases. Therefore, accuracy requirements of metrology processes and tools have become more stringent. In addition, as the dimensions of semiconductor devices shrink, the capability of metrology tools (e.g., resolution) have increased. In many instances, previously sufficient technologies (e.g., optical microscopy) have been replaced with more advanced and complex technologies (e.g., scanning electron microscopy, "SEM").

Such advanced technologies, aside from being complex, often have different problems than previously used metrology technologies. For instance, it is well known that 193 nm resist features change size permanently (e.g., shrink) during CD-SEM measurements. The shrinkage will have an effect on the semiconductor features formed using the resist. The extent of the shrinkage, often up to 40 nm, should be compared to the CD metrology budget of 1 nm for features in the 100 nm design rule node, at which 193 nm lithography is expected to enter production for critical layers. Most resist classes and layer schemes exhibit shrinkage to varying degrees depending on their formulations, process history, and measurement conditions. Shrinkage is observed to progress in a non-linear manner with applied e-beam dose, and understanding the mechanisms that contribute to this shrinkage is complex. Several studies have reported the attempt to improve this understanding as a basis to improve the resist materials. As yet, complete elimination of e-beam initiated shrinkage has not been achieved.

Shrinkage has previously been reported to change in an absolute way, rather than as a percentage of feature size. This absolute change implies that shrinkage is a surface effect, which is easily understood due to the limited penetration depth of the electrons from the CD-SEM. As described by Hoffmann et al., in "Investigation of 193 nm Resist Shrinkage During CD-SEM Measurements," Yield Management Solutions, Fall 2001, pp. 32-36, decreasing the electron beam energy reduced the size of all shrinkage mechanisms. Hoffmann et al. demonstrate this effect with measurements taken with a 400 eV beam. This dependency can be understood because the interaction volume is smaller and less energy is deposited in the resist as the energy decreases. Estimates of the range taken from published tables show that expected electron penetration depths are consistent with energy dependence seen in the data. Hoffmann et al. also note that the lower energy data shows greater scattering because the smaller number of secondary electrons emitted from the sample reduces the signal-to-noise ratio of the linescan signals.

First experiments performed by Hoffmann et al. indicated that beam current has little effect on shrinkage. However, further data shows that the intermediate shrinkage region for all beam currents overlap, in agreement with the early observations that this regime is independent of beam current. The long term shrinkage mechanism also changes with beam current. At 40 pA, a higher than normal beam current, a trench can be seen to narrow once the other mechanisms have stabilized. An alternative analysis of the beam current data with different applied offsets could lead to the conclusion that all of the shrinkage regimes depend on beam current. The precision of the data did not vary greatly until the beam current was reduced to 5 pA, which reflects the reduced signal-to-noise at this low beam current, analogous to the trend with beam energy.

Irrespective of the different mechanisms occurring in the resist, the above work has been used to make recommendations for 193 nm resist measurements. Lithographic performance is best characterized by measuring feature dimensions before induced shrinkage. Therefore, it would be advantageous to substantially reduce shrinkage to increase the usefulness of the SEM measurements. In production, after-develop inspection (ADI) is used to control and predict the after-etch (AEI) feature size. The etch environment may quickly cause the resist to shrink in a manner similar to which it shrinks in the CD-SEM. It is tempting to suggest that, under these conditions, measuring the fully shrunken dimensions at ADI might give a reasonable prediction of the AEI dimension.

In determining zero-dose dimensions (i.e., dimensions of the resist before exposure to the electron beam), it is vital to consider sources of random and systematic error in the measurements. Random errors can be attributed to variations in linescans caused by the usual effects that contribute to static and dynamic precision in a CD-SEM. Systematic errors may be attributed to uncertainties in the fits of successive measurements leading to the estimates of the CD of the undosed feature. In 248 nm resist metrology, systematic errors could largely be ignored, and the best conditions could be chosen to optimize dynamic precision. For 193 nm resist metrology, the systematic errors can no longer be ignored.

To reduce systematic errors, multiple measurements could be taken in a dose regime where the medium term mechanism dominates. An e-beam current of 10 pA will allow reduced contributions to the systematic errors from the fast shrinkage mechanism and still allow good signal-to-noise to be obtained. A beam energy of around 500 eV should be the optimum balancing point between "dynamic" and "systematic" errors. Using a beam energy of 400 eV would not provide enough signal-to-noise ratio for good statistics on the linescan data, and challenges the creation of truly robust production recipes. 600 eV may be tolerable, but higher energies would cause greater systematic uncertainties. Manual measurements cannot be used because the uncontrolled dosing of samples would lead to variations in shrinkage.

Once collected, the trend of the data has to be corrected for shrinkage. A linear fit would no longer be sufficient, as the fast shrinkage has to be accounted for in the correction. Accurate correction of this fast shrinkage is likely to give the most problems in future metrology. The coefficient of the fit would depend on the resist and measurement conditions.

As the beam energy and current are reduced, other problems with the SEM performance may arise. For example, low beam energy can produce a relatively small signal-to-noise ratio and loss in image resolution that can introduce uncertainty into the measurements. Therefore, some attempts to offset the low beam energy and current have been made. For example, Applied Materials, Inc., Santa Clara, Calif., has introduced a CD-SEM that provides precision level capabilities that are a result of the design of its electron beam column, and the various algorithms it uses in its measurements. For instance, the tool has an improved accelerating module in the column, which accelerates the electrons about 50 times faster than before, to produce a narrow beam and a small spot size, which results in higher resolution and better precision. However, this is also attained using lower voltages. While a standard CD-SEM operates within a range of 400-800 eV, the new platform is fully operational at less than or equal to 200 eV. This capability provides the device maker with minimal and stable resist shrinkage, enabling tight metrology for 193 nm lithography.

Attempts have, therefore, been made to reduce the current and landing energy (power density) of the incoming beam in a SEM in order to reduce shrinkage. There are, however, several disadvantages to these methods and systems. For example, as current and landing energies are reduced, image resolution and throughput suffer. In addition, current and landing energies have been reduced to a level that still causes shrinkage in the photoresist. The alternative approach requires significant increases in landing energy, to the order of several tens of kV, such that the deposited electron energy is well below the photoresist surface thereby limiting surface damage to the photoresist and reducing line shrinkage. However, such approaches increase the risk that the deposited electron energy may damage other structures that may be present on the wafer. In addition, altering the electron column to increase electron acceleration as described above may increase the complexity and cost of the system.

In a related theme, suggestions have been made that resists could be stabilized, presumably both against e-beam- and etch-induced shrinkage, by introducing a pre-conditioning process such as UV irradiation, e-beam cure, or thermal processing. For example, as described in U.S. Patent Application Publication No. US 2003/0132197 by Ke et al., e-beam curing is the use of an e-beam to cure the photoresist so that it subsequently will not shrink when CD-SEM measurements are taken. The cross-linking of the resist caused by e-beam curing, which prevents subsequent resist shrinkage, however, also affects the profile of the photoresist, especially in corner areas. This is disadvantageous because it means that the photoresist itself changes shape, which is problematic for later semiconductor fabrication processing that contemplates usage of a particular shape or profile of the resist. E-beam curing may also potentially cause electron charge damage to the semiconductor device being fabricated. Ke et al. also describe using plasma curing to prevent photoresist shrinkage.

Accordingly, it may be advantageous to develop systems and methods for reducing, and even substantially eliminating, the distortion and/or shrinkage of a resist during a metrology process without decreasing the image resolution and throughput, without increasing the risk of electron beam damage to other structures present on the specimen, and without substantial changes to the electron column, in the case of an electron beam metrology tool.

SUMMARY OF THE INVENTION

The following description of various embodiments of systems and methods is not to be construed in any way as limiting the subject matter of the appended claims.

One embodiment relates to a system configured to reduce distortion of a resist during a metrology process. The system includes an electron beam metrology tool configured to measure one or more characteristics of one or more resist features formed on a specimen. The system also includes a cooling subsystem coupled to the electron beam metrology tool. The cooling subsystem is configured to alter a temperature of the specimen during measurements by the electron beam metrology tool such that the one or more resist features are not substantially distorted during the measurements.

In one embodiment, the electron beam metrology tool may be configured as a scanning electron microscope. However, the electron beam metrology tool may be configured as any other electron beam metrology tool known in the art (e.g., a secondary emission electron microscope, a tunneling electron microscope, etc.). In addition, the electron beam metrology tool may be replaced with another charged particle beam metrology tool such as an ion beam-based metrology tool although ion beam-based metrology tools tend to cause less resist distortion than electron beam metrology tools. In some embodiments, the resist may be designed for exposure at a wavelength of about 193 nm. However, the resist may be designed for exposure at any wavelength less than about 193 nm (e.g., 157 nm). In addition, the resist may include any other known resist material, including those that may experience distortion during measurements with currently used metrology systems.

In one embodiment, the cooling subsystem may be configured to alter the temperature of substantially an entirety of the specimen substantially simultaneously. In a different embodiment, the cooling subsystem may be configured to alter the temperature of a portion of the specimen. The portion may be determined based on an area of the specimen in which the measurements are to be performed.

According to one embodiment, the cooling subsystem may be configured to alter the temperature of a portion of the specimen using one or more gases. In one such embodiment, the one or more gases may be cooled using liquid nitrogen. In another embodiment, the cooling subsystem includes a liquid nitrogen cooled condenser. In an additional embodiment, the cooling subsystem may be configured to alter the temperature of a portion of the specimen using liquid nitrogen. In a different embodiment, the cooling subsystem may include a Peltier element coupled to a copper heatsink. The copper heatsink may be coupled to a thermally isolated stage. The specimen is disposed upon the Peltier cooling element during the measurements. In other embodiments, the cooling subsystem may include a condenser that is cooled by a Peltier cooling element.

In some embodiments, the cooling subsystem may be configured to alter the temperature of the specimen while the specimen is disposed in a load chamber of the electron beam metrology tool. In other embodiments, the cooling subsystem may be coupled to a measurement chamber of the electron beam metrology tool. In additional embodiments, the cooling subsystem may be coupled to a stage located in a measurement chamber of the electron beam metrology tool. Each of the embodiments of the system described above may be further configured as described herein.

Another embodiment relates to a different system that is configured to reduce distortion of a resist during a metrology process. Like the embodiments described above, this embodiment includes an electron beam metrology tool configured to measure one or more characteristics of one or more resist features formed on a specimen. This system, however, includes a drying subsystem that is coupled to the electron beam metrology tool. The drying subsystem is configured to reduce moisture proximate the specimen during measurements by the electron beam metrology tool such that the one or more resist features are not substantially distorted during the measurements.

The term "moisture proximate the specimen" is generally defined as moisture that is present on a surface of the specimen (e.g., adsorbed on a surface of the specimen). However, this term may also be defined as moisture that is present in the specimen (e.g., within a layer formed on the specimen).

In one embodiment, the drying subsystem may be configured to reduce the moisture by heating substantially an entirety of the specimen substantially simultaneously. In another embodiment, the drying subsystem may be configured to reduce the moisture by heating a portion of the specimen. In a further embodiment, the drying subsystem may be configured to reduce the moisture by heating the specimen to evaporate the moisture from the specimen. In such an embodiment, the drying subsystem may be configured to collect the moisture using a moisture getter assembly. In a different embodiment, the drying subsystem may be configured to reduce the moisture by causing desorption of the moisture from the specimen with a vacuum. In some embodiments, the drying subsystem may be coupled to a measurement chamber of the electron beam metrology tool. Each of the embodiments of the system described above may be further configured as described herein.

An additional embodiment relates to yet another different system configured to reduce distortion of a resist during a metrology process. Like the systems described above, this system includes an electron beam metrology tool configured to measure one or more characteristics of one or more resist features formed on a specimen. The electron beam metrology tool may be configured as described herein. The system also includes a cooling subsystem coupled to the electron beam metrology tool. The cooling subsystem may be configured as described herein. In addition, the system includes a drying subsystem that is coupled to the electron beam metrology tool. The drying subsystem may be configured as described herein. This system embodiment may also be further configured as described herein.

Another embodiment relates to a method for reducing distortion of a resist during a metrology process. The method includes altering a temperature of a specimen before and/or during measurements by an electron beam metrology tool such that one or more resist features on the specimen are not substantially distorted during the measurements. The method may also include measuring one or more characteristics of the one or more resist features formed on the specimen using the electron beam metrology tool. In one embodiment, the electron beam metrology tool may be configured as a scanning electron microscope. In another embodiment, the resist may be designed for exposure at a wavelength of about 193 nm or at a wavelength less than about 193 nm.

In some embodiments, altering the temperature of the specimen may include altering the temperature of substantially an entirety of the specimen substantially simultaneously. In a different embodiment, altering the temperature of the specimen may include altering the temperature of a portion of the specimen. The portion may be determined based on an area of the specimen in which the measurements are to be performed. In another embodiment, the temperature of the specimen may be altered while the specimen is disposed in a load chamber of the electron beam metrology tool. Each of the embodiments of the method described above may include any other step(s) described herein.

Yet another embodiment relates to a different method for reducing distortion of a resist during a metrology process. The method includes reducing moisture proximate a specimen during measurements by an electron beam metrology tool such that one or more resist features on the specimen are not substantially distorted during measurements. The method may also include measuring one or more characteristics of the one or more resist features formed on the specimen using the electron beam metrology tool. In one embodiment, the electron beam metrology tool may be configured as a scanning electron microscope. In another embodiment, the resist may be designed for exposure at a wavelength of about 193 nm or at a wavelength less than about 193 nm.

In one embodiment, reducing the moisture proximate the specimen may include reducing the moisture by heating substantially an entirety of the specimen substantially simultaneously. In a different embodiment, reducing the moisture may include reducing the moisture by heating a portion of the specimen. In some embodiments, reducing the moisture may include reducing the moisture by heating the specimen to evaporate the moisture from the specimen and collecting the moisture using a moisture getter assembly. In other embodiments, reducing the moisture proximate the specimen may include reducing the moisture by causing desorption of the moisture from the specimen with a vacuum. Each of the embodiments of the method described above may include any additional step(s) described herein.

A further embodiment relates to another method for reducing distortion of a resist during a metrology process. This method includes altering a temperature of a specimen during measurements by an electron beam metrology tool such that one or more resist features on the specimen are not substantially distorted during the measurements. This method also includes reducing moisture proximate the specimen during measurements by the electron beam metrology tool such that the one or more resist features are not substantially distorted during the measurements. This method may also include measuring one or more characteristics of one or more resist features formed on a specimen. This embodiment may also include any additional step(s) described herein.

Another embodiment relates to a system configured to reduce alteration of a specimen during analysis. The system includes a vacuum chamber in which the specimen is disposed during the analysis. The system also includes an element disposed within the vacuum chamber. A surface of the element is cooled such that molecules in the vacuum chamber are adsorbed onto the surface and cannot cause reduction in a dimension of a resist structure formed on the specimen during the analysis.

In one embodiment, the molecules include water vapor. In another embodiment, the surface of the element is cooled such that a temperature of the specimen is not substantially altered by the element. In some embodiments, the element is disposed along an inner surface of the vacuum chamber. In other embodiments, the element is disposed above the specimen. Each of the embodiments of the system described above may be further configured as described herein.

A further embodiment relates to a system configured to analyze a specimen. The system includes an analysis subsystem configured to analyze the specimen while the specimen is disposed in a vacuum chamber. The system also includes an element disposed within the vacuum chamber. A surface of the element is cooled such that molecules in the vacuum chamber are adsorbed onto the surface and cannot cause reduction in a dimension of a resist structure formed on the specimen during the analysis.

In one embodiment, the molecules include water vapor. In another embodiment, the analysis subsystem includes a charged particle beam based subsystem. In an additional embodiment, the analysis subsystem is configured to analyze the specimen using a technique that involves direct or incidental electron or ion ejection. In some embodiments, the analysis subsystem is configured to analyze the specimen using incident x-rays. In a further embodiment, the analysis subsystem is configured as an inspection subsystem, a metrology subsystem or an inspection and metrology subsystem.

In one embodiment, the system is configured to control a cooling subsystem coupled to the element such that the surface of the element is not cooled during the analysis. In another embodiment, the system is configured to control a cooling subsystem coupled to the element such that the surface of the element is cooled while the analysis subsystem is performing one or more pre-analysis functions.

In some embodiments, the element is disposed along an inner surface of the vacuum chamber and outside of a measurement path of the analysis subsystem. In other embodiments, the element is disposed between the specimen and the analysis subsystem. In such an embodiment, the element is configured such that a measurement path of the analysis subsystem passes through the element. In different embodiments, the element is coupled to the analysis subsystem. In a further embodiment, the element is configured such that a temperature of the specimen is not substantially altered by the surface of the element. Each of the embodiments of the system described above may be further configured as described herein.

An additional embodiment relates to a method for reducing alteration of a specimen during analysis. The method includes creating a vacuum in a chamber in which the specimen is disposed during the analysis. The method also includes cooling a surface of an element disposed in the chamber to cause molecules in the chamber to be adsorbed onto the surface such that the molecules cannot cause reduction in a dimension of a resist structure formed on the specimen during the analysis.

In one embodiment, cooling of the surface of the element is not performed during the analysis. In another embodiment, cooling of the surface of the element is performed during one or more pre-analysis functions performed while the specimen is in the chamber. In one such embodiment, cooling is not performed during the analysis. In some embodiments, the analysis includes inspection or metrology. In another embodiment, a temperature of the specimen is not substantially altered by the cooling. In a further embodiment, the molecules include water vapor. Each of the embodiments of the method described above may include any other step(s) described herein.

Yet another embodiment relates to a system configured to analyze a specimen. The system includes a scanning probe microscope configured to analyze the specimen while the specimen is disposed in an analysis chamber. The system also includes an element disposed within the analysis chamber. A surface of the element is cooled such that molecules in the analysis chamber are adsorbed onto the surface and cannot cause reduction in a dimension of a resist structure formed on the specimen during the analysis. In one embodiment, the scanning probe microscope is configured as an atomic force microscope or a scanning tunneling electron microscope. Each of the embodiments of the system described above may be further configured as described herein.

BRIEF DESCRIPTION OF THE DRAWINGS

Further advantages of the present invention may become apparent to those skilled in the art with the benefit of the following detailed description of the preferred embodiments and upon reference to the accompanying drawings in which.

Figure 1:
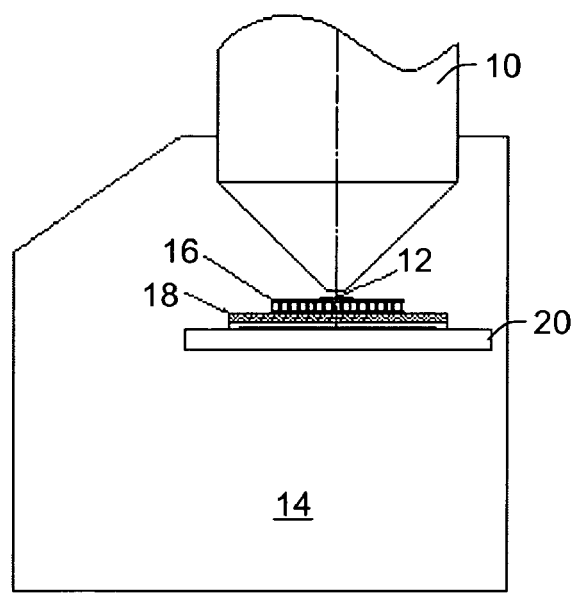
FIGS. 1-7 are schematic diagrams illustrating side views of different embodiments of a system configured to reduce distortion of a resist during a metrology process.

While the invention is susceptible to various modifications and alternative forms, specific embodiments thereof are shown by way of example in the drawings and may herein be described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Some embodiments described herein generally relate to systems and methods for controlling the surface temperature and/or native moisture temperature or concentration on semiconductor wafers or other specimens by cooling or heating in order to reduce, and even substantially eliminate, shrinkage of photo resist during metrology processes. This reduction in shrinkage can be accomplished through a macro change in wafer temperature, by either heating or cooling, or a significant improvement in the vacuum quality to impose a rapid desorption of surface moisture.

The embodiments described herein are advantageous in that the surface temperature and moisture of a specimen can be controlled to reduce, and even eliminate, resist distortion due to a metrology process without manipulating or inhibiting the current and landing energies used on scanning electron microscopes (SEMs). Therefore, distortion of a resist during a metrology process can be reduced without decreasing the image resolution and throughput. In addition, resist distortion can be reduced without increasing the risk of electron beam damage to other structures present on the specimen. Furthermore, distortion of resist structures can be reduced without substantial changes to the electron column, in the case of an electron beam metrology tool.

As used herein, the term "specimen" refers to a reticle or a wafer. The terms "reticle" and "mask" are used interchangeably herein. A reticle generally includes a transparent substrate such as glass, borosilicate glass, and fused silica having opaque regions formed thereon in a pattern. The opaque regions may be replaced by regions etched into the transparent substrate. Many different types of reticles are known in the art, and the term reticle as used herein is intended to encompass all types of reticles.

As used herein, the term "wafer" generally refers to substrates formed of a semiconductor or non-semiconductor material. Examples of such a semiconductor or non-semiconductor material include, but are not limited to, monocrystalline silicon, gallium arsenide, and indium phosphide. Such substrates may be commonly found and/or processed in semiconductor fabrication facilities. A wafer may include one or more layers formed upon a substrate. For example, such layers may include, but are not limited to, a resist, a dielectric material, and a conductive material. Many different types of such layers are known in the art, and the term wafer as used herein is intended to encompass a wafer including all types of such layers.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

A "resist" may be a photoresist material that can be patterned by an optical lithography technique. For example, a resist may be patterned by selective exposure to light having a wavelength of about 248 nm, about 193 nm, about 157 nm, or any other suitable wavelength known in the art. A resist may include other resists, however, such as e-beam resists or X-ray resists that may be patterned by an e-beam or X-ray lithography technique, respectively. In addition, the resist may include any other known resist material, including those that may experience distortion during measurements with currently used metrology systems.

In addition, although embodiments are described herein with respect to a resist, it is to be understood that the systems described herein may be used with any material that may be distorted during a metrology process. The term "specimen" may also be defined as any substrate on which a material is formed that is to be measured using a metrology process in which distortion of the material may occur.

As used herein, the term "feature" generally refers to any structure formed on a substrate that has some lateral extent in three-dimensions (i.e., a width as well as a height). Examples of features include patterned structures formed on semiconductor wafers. Patterned structures may be formed on semiconductor wafers using any process known in the art (e.g., lithography and etch). The features may be formed of any material known in the art such as a resist. However, features may also be formed of a conductive material and an insulating material. The terms "feature" and "structure" are used interchangeably herein.

The term "distortion" of a resist can be generally defined as shrinkage (i.e., reduction in one or more dimensions) of the resist that may occur due to exposure to electron beam energy during an electron beam based metrology process. However, the term "distortion" is also used herein to refer to any alteration in a resist that takes place due to one or more parameters of a metrology process regardless of the mechanism for such alterations. Alterations of the resist may include, for example, changes in shape, dimensions (e.g., height, width, etc.), top rounding, profile, corner rounding, and the like. Distortions that are primarily of interest in resist metrology are generally caused by exposure to electron beam energy in electron beam metrology tools (e.g., SEMs). However, it is to be understood that application of the systems and methods described herein to other metrology processes and tools is within the scope of the present invention.

The term "electron beam metrology tool" is intended to encompass any electron beam metrology tool known in the art (e.g., a SEM, a secondary emission electron microscope, a tunneling electron microscope, etc.). In addition, the electron beam metrology tool may be replaced with another charged particle beam metrology tool such as an ion beam-based metrology tool although ion beam-based metrology tools tend to cause less resist distortion than electron beam metrology tools.

Furthermore, it is to be understood that the systems and methods described herein may also be applied to non-metrology measurements and tools. For example, the systems and methods described herein may be applied to inspection methods and tools and/or defect review methods and tools. In particular, the systems and methods described herein may be applied to inspection and defect review methods and tools in which some distortion of a resist or other material on the specimen may occur during inspection and/or review.

An electron beam metrology tool such as a SEM can be used to measure one or more characteristics of one or more resist features and other features formed on a specimen. For example, measurements are generally performed using a SEM based approach to analyze the three-dimensional (3D) shape of the resist profile. Examples of methods for developing a virtual 3D representation of a photoresist feature are illustrated in U.S. Pat. No. 6,651,226 to Houge et al., which is incorporated by reference as if fully set forth herein. The SEM approaches can either "grab" multiple images at small tilt angles to infer the shape of resist features or perform a signal analysis of the shape of the scattered electron profile. In addition, electron beam metrology tools can be used to determine characteristics such as height, width, etc. SEM based systems are commercially available from, for example, Applied Materials, Santa Clara, Calif. and KLA-Tencor, San Jose, Calif. Examples of appropriate SEM based systems that are available from KLA-Tencor include the 8250, 8250-R, 8450, and eCD-1 systems.

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals.

FIG. 1 illustrates one embodiment of a system configured to reduce distortion of a resist during a metrology process. The system includes electron column 10. Electron column 10 forms part of an electron beam metrology tool. The electron beam metrology tool is configured to measure one or more characteristics of one or more resist features (not shown) formed on specimen 12. The electron column generally functions to focus electrons on specimen 12. As shown in FIG. 1, at least the portion of the electron column proximate the specimen where the electrons exit the electron column is located in vacuum chamber 14. Specimen 12 is also located in vacuum chamber 14. The configuration of vacuum chamber 14 may vary depending on, for example, the configuration of the electron beam metrology tool.

The system shown in FIG. 1 also includes a cooling subsystem coupled to the electron beam metrology tool. The cooling subsystem is configured to alter a temperature of (i.e., cool) the specimen during measurements by the electron beam metrology tool such that one or more resist features formed on the specimen are not substantially distorted during the measurements. In particular, the cooling subsystem may be configured to alter a temperature of the specimen before and/or during the measurements such that the temperature of the specimen during the measurements is reduced.

In this embodiment, the cooling subsystem includes Peltier cooling element 16 coupled to copper heatsink 18. The copper heatsink may have any suitable configuration known in the art and may be replaced with another heatsink formed of any appropriate material known in the art. The copper heatsink is coupled to thermally isolated stage 20. As such, the cooling subsystem is disposed in a measurement chamber of the electron beam metrology tool. In particular, the cooling subsystem is coupled to a stage located in a measurement chamber of the electron beam metrology tool (i.e., in the vacuum chamber in which measurements take place). Thermally isolated stage 20 may include any suitable stage known in the art. For example, the stage may include any suitable mechanical or robotic assembly known in the art. Specimen 12 is disposed upon Peltier cooling element 16 during the measurements. Therefore, the cooling subsystem provides support for the specimen during measurements. In addition, the cooling subsystem may be coupled to the measurement chamber of the electron beam metrology tool.

The Peltier cooling element may include any appropriate Peltier cooling element known in the art. In general, a Peltier cooling element includes two dissimilar conductors or semiconductors at the junction of which heat is absorbed when an electric current is passed through the junction. The rate of absorption of heat at the junction is directly proportional to the electric current. The effect arises because the potential energy of the charge carriers is different in the two conductors and also because the scattering mechanisms that govern the equilibrium between the charge carriers and the crystal lattice differ in the two conductors. Therefore, the Peltier Effect is not ascribed to either material alone but rather is a consequence of the junction. In order to maintain a conservation of energy as well as a conservation of charge when charge carriers move across the junction, energy must be interchanged with the surroundings of the junction (e.g., with the copper heatsink).

Peltier cooling elements, which are also commonly known as "Peltier devices" or "thermoelectric (TE) modules," are relatively small solid-state devices. A "typical" unit is a few millimeters thick by a few millimeters to a few centimeters square. Peltier cooling elements are sandwiches formed by two ceramic plates with an array of small bismuth telluride cubes ("couples") in between. When a DC current is applied, heat is moved from one side of the device to the other (e.g., from the side of the Peltier cooling element in contact with the specimen to the other side of the Peltier cooling element) where it is removed with a heatsink (e.g., the copper heatsink). Peltier cooling elements are commercially available from a number of companies such as Cidete Ingenieros SL, Barcelona, Spain, HiTech Technologies, Yardley, Pa., Komatsu Electronics, Japan, Kryotherm, Saint Petersburg, Russia, Marlow Industries, Dallas, Tex., and Melcor, Trenton, N.J. Examples of Peltier cooling elements that may be suitable for use in the systems described herein are illustrated in U.S. Pat. Nos. 6,745,575 to Butcher and 6,748,747 to Hoschek, which are incorporated by reference as if fully set forth herein.

The Peltier cooling element may be configured to cool only a portion of the specimen (e.g., the portion of the specimen on which the measurements will be performed). The portion of the specimen that is cooled by the cooling subsystem may be determined based on the area of the specimen in which the measurements are to be performed. In this manner, the cooling subsystem may be configured for localized cooling of the specimen. Alternatively, the Peltier cooling element may be configured to cool substantially an entirety of the specimen substantially simultaneously. The area of the specimen that is cooled may be varied by altering the lateral dimensions of the Peltier cooling element thereby changing the area of the specimen that is contacted by the Peltier cooling element.

In addition, although only one Peltier cooling element is shown in FIG. 1, it is to be understood that the system may include more than one Peltier cooling element, each of which may be coupled to the same heatsink or different heatsinks. The Peltier cooling elements may be configured to cool different portions of the specimen (e.g., a portion of the specimen being measured and a portion of the specimen to be measured) substantially simultaneously.

As shown in FIG. 1, the cooling subsystem is disposed within and/or coupled to a measurement chamber of the electron beam metrology tool (i.e., vacuum chamber 14). However, it is to be understood that such a cooling subsystem may also be coupled to a load chamber (not shown), which is also commonly referred to as a "load lock," of the electron beam metrology tool. In addition, the system may include more than one cooling subsystem, each coupled to a different chamber of the metrology tool. Alternatively, the system may include the cooling subsystem shown in FIG. 1 coupled to the measurement chamber or the load chamber and a differently configured cooling subsystem (e.g., a cooling subsystem described below) coupled to the other chamber. In this manner, the system may include differently configured cooling subsystems, each of which is coupled to a different chamber of the metrology tool. The embodiment of the system shown in FIG. 1 may be further configured as described herein.

The temperature to which the specimen is cooled before and/or during measurements may vary depending on, for example, the composition of the resist features being measured and the parameters of the electron column (beam energy, current, etc.). For example, it may be desirable to reduce the temperature of the specimen before the measurements such that the temperature of the resist on the specimen during the measurements remains relatively low. Additionally, or alternatively, the temperature of the specimen may be reduced during the measurements to offset any heating that may be caused by the electrons such that the temperature of the resist remains substantially constant throughout the measurements.

In particular, it may be desirable for the temperature of the resist to not exceed the glass transition temperature of the resist during the measurements. If the temperature of the resist exceeds the glass transition temperature, then the resist may be more susceptible to distortion by the electrons of the electron beam metrology tool. Accordingly, since the glass transition temperature varies with material, an appropriate temperature to cool a resist to will vary depending on the resist. Examples of appropriate temperatures to which the specimen may be cooled may be about 20° C., or less than about 20° C. (e.g., about 15° C., about 10° C., etc.). Therefore, the degree of cooling is similar to that used in other processes (e.g., the "chill plates" used in lithography processes). In addition, since the glass transition temperatures of most photoresists are usually much higher than 20° C. (e.g., higher than 80° C.), it is believed that the temperature of the specimen can be held to a reasonably low temperature throughout the measurements regardless of the parameters of the electron beam metrology tool. The temperature to which the specimen is cooled before and/or during the measurements may vary in a similar manner depending on other characteristics of the resist and/or specimen and previous processing of the resist and/or specimen.

Figure 2:
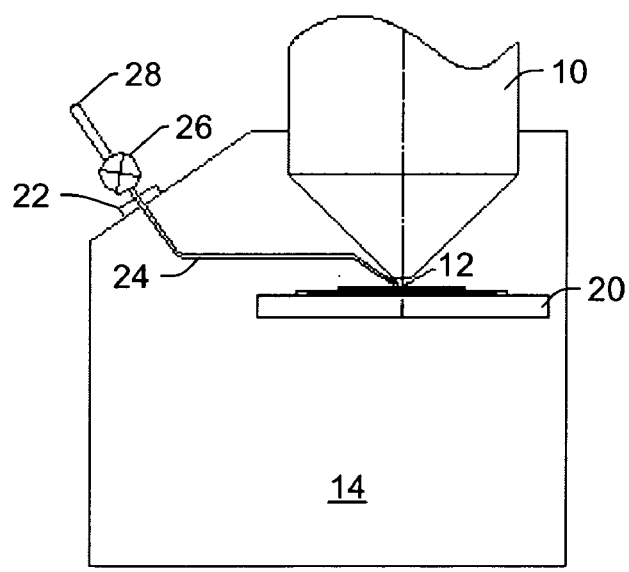

Another embodiment of a system configured to reduce distortion of a resist during a metrology process is shown in FIG. 2. Like the above described embodiment, this system includes electron column 10, which may be part of an electron beam metrology tool. The electron beam metrology tool is configured to measure one or more characteristics of one or more resist features (not shown) formed on specimen 12. The electron column and the electron beam metrology tool may be further configured as described herein. As shown in FIG. 2, at least the portion of the electron column proximate the specimen where the electrons exit the electron column is located in vacuum chamber 14. Specimen 12 is also located in vacuum chamber 14. The configuration of vacuum chamber 14 may vary depending on, for example, the configuration of the electron beam metrology tool.

In the embodiment shown in FIG. 2, the configuration of the vacuum chamber also depends on the configuration of the cooling subsystem. For instance, in this embodiment, the vacuum chamber is configured to accommodate vacuum feedthrough 22. Vacuum feedthrough 22 couples conduit 24 to vacuum chamber 14 such that the conduit passes through the wall of the vacuum chamber without compromising the vacuum level in the vacuum chamber. Vacuum feedthrough 22 and conduit 24 may include any appropriate components known in the art. Conduit 24 may be configured to direct one or more fluids to an upper surface of specimen 12 (i.e., the surface of the specimen on which the resist feature(s) are formed) while the specimen is disposed on stage 20. Stage 20 may be a thermally isolated stage and may be further configured as described herein. Conduit 24 may be coupled to a fluid reservoir (not shown) via valve 26 and conduit 28. Valve 26 and conduit 28 may include any suitable components known in the art. In one embodiment, the fluid that is provided to the specimen upper surface is liquid nitrogen.

The cooling subsystem is, therefore, coupled to the electron beam metrology tool. The cooling subsystem is configured to alter a temperature of the specimen during measurements by the electron beam metrology tool such that one or more resist features formed on the specimen are not substantially distorted during the measurements. In particular, the cooling subsystem may be configured to alter a temperature of the specimen before and/or during the measurements such that the temperature of the specimen during the measurements is maintained at a reasonably low level. The temperature to which the specimen is cooled may be determined as described above.

In the above described embodiment, the cooling subsystem is configured to alter the temperature of the specimen using liquid nitrogen. In particular, the cooling subsystem may be configured to alter the temperature of a portion of the specimen using liquid nitrogen. However, it is to be understood that the cooling subsystem shown in FIG. 2 may be configured to alter the temperature of a portion of the specimen using any other appropriate fluid (e.g., helium or a noble gas) known in the art. Preferably, the cooling subsystem is configured to cool the specimen using one or more fluids, which will not adversely affect the characteristics of the specimen and resist features formed on the specimen. For example, the one or more fluids used by the cooling subsystem are preferably substantially inert with respect to the specimen, the resist, and any other materials formed on the specimen. In addition, the fluid flow characteristics of the one or more fluids (e.g., flow rate, pressure, etc.) may be selected such that the one or more fluids do not adversely affect the characteristics of the specimen, the resist, and any other materials on the specimen.

The portion of the specimen that is cooled by the cooling subsystem may be determined based on the area of the specimen in which the measurements are to be performed. For example, the cooling subsystem may be configured to cool at least the portion of the specimen that will be or is being measured. In this manner, the cooling subsystem may be configured for localized cooling of the specimen. The localized cooling will have substantially no impact on the entire specimen (e.g., will not affect global dimensional integrity of the specimen). Alternatively, the cooling subsystem may be configured to cool substantially an entirety of the specimen substantially simultaneously. For example, the cooling subsystem may be configured such that the fluid exiting conduit 24 moves across a relatively large area of the specimen.

In another example, the cooling subsystem may include more than one such conduit, each of which is configured to direct one or more fluids onto different portions of the specimen. Therefore, different portions of the specimen may be cooled independently. In addition, the different portions of the specimen may be cooled sequentially or simultaneously. In a further example, the cooling subsystem may be controllable such that the exit of conduit 24 may be positioned above different portions of the specimen. In this manner, the conduit may move above the specimen such that selected portion(s) of the specimen are cooled. As such, different portions of the specimen may be cooled in a sequential manner. The different portions that are cooled may include, for example, a portion of the specimen being measured and a portion of the specimen to be measured.

As shown in FIG. 2, the cooling subsystem is coupled to a measurement chamber of the electron beam metrology tool (i.e., vacuum chamber 14). In addition, since the cooling subsystem is configured to direct one or more fluids onto specimen 12 while it is disposed on stage 20, the cooling subsystem is effectively coupled to stage 20. However, it is to be understood that such a cooling subsystem may also be coupled to a load chamber (not shown) of the electron beam metrology tool. In addition, the system may include more than one such cooling subsystem, each coupled to a different chamber of the metrology tool. Alternatively, the system may include a cooling subsystem as shown in FIG. 2 coupled to the measurement chamber or the load chamber and a differently configured cooling subsystem (e.g., the cooling subsystem shown in FIG. 1) coupled to the other chamber. In this manner, the system may include differently configured cooling subsystems, each of which is coupled to a different chamber of the metrology tool. The embodiment of the system shown in FIG. 2 may be further configured as described herein.

Figure 3:
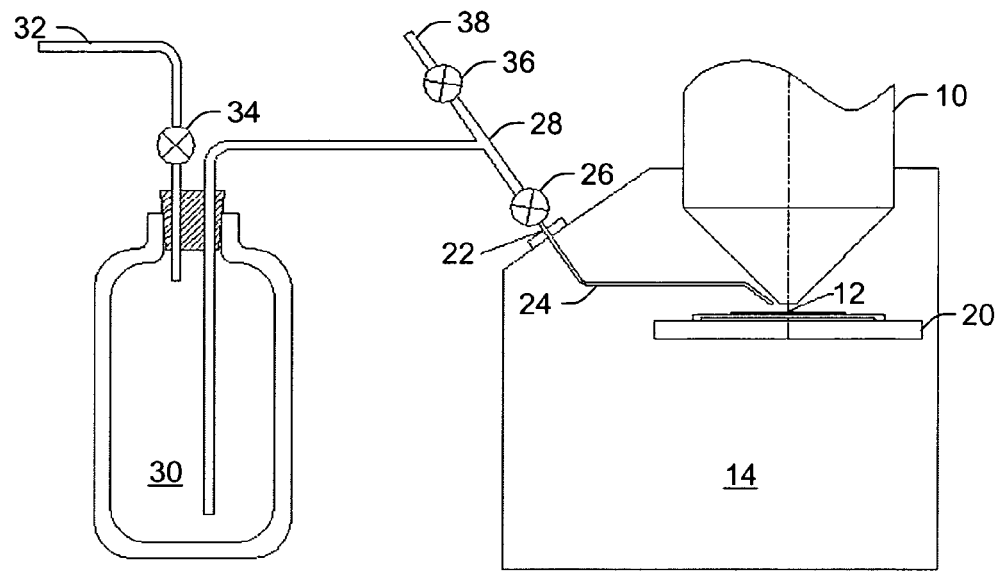

FIG. 3 illustrates one particular embodiment of the system shown in FIG. 2. The elements shown in FIG. 3 that are also shown in FIG. 2 may be configured as described above. The system shown in FIG. 3 also illustrates one particular fluid handling subsystem that can be used to deliver one or more fluids such as liquid nitrogen to specimen 12. For example, as shown in FIG. 3, conduit 24 is coupled to valve 26, which in this embodiment may be a "feed valve." Valve 26 is coupled to conduit 28, which in this embodiment forms the "feed line" for the one or more fluids. For example, conduit 28 may be coupled to Dewar flask 30. Valve 26 and conduits 24 and 28 may include any appropriate components known in the art.

A Dewar flask is a glass vessel that is configured to provide thermal insulation. For instance, when filled with a cold liquid, the vessel will not allow the liquid to easily heat up, and the liquid will stay cool for a far longer time than in a typical container. In form, a Dewar flask is a glass bottle, with a double layer construction. In fact, it can be considered to be two thin-walled bottles nestled one inside the other and sealed together at the neck. The narrow space between the bottles is evacuated almost entirely of air, and the near vacuum prevents conduction of heat. Dewar flasks are commonly used to store liquid nitrogen. In this case, the leakage of heat into the extremely cold interior of the bottle results in a slow "boiling-off" of the liquid (a valve is provided to prevent pressure from building up). The excellent insulation of the Dewar flask results in a very slow "boil;" and thus, the liquid nitrogen lasts a relatively long time without the need for expensive refrigeration equipment.

The Dewar flask is, therefore, used as a reservoir for the one or more fluids used by the cooling subsystem. The Dewar flask may also be replaced by any other suitable containment vessel known in the art. An appropriate containment vessel may vary depending on the one or more fluids used by the cooling subsystem.

As shown in FIG. 3, Dewar flask 30 may also be coupled to conduit 32 by pressurizing valve 34. Conduit 32 may be configured to provide a supply of pressurizing gas to the Dewar flask through the pressurizing valve. The pressurizing gas may include any appropriate gas known in the art. The pressurizing gas may be used to facilitate flow of the fluid(s) in the Dewar flask, through conduit 28 and onto specimen 12. Conduit 32 and pressurizing valve 34 may include any appropriate components known in the art.

As further shown in FIG. 3, conduit 28 is coupled to flush valve 36. Flush valve 36 couples the conduit to flush conduit 38. The flush valve and the flush conduit may be used to remove unused liquid nitrogen from the cooling subsystem after measurements have been performed. In addition, the flush valve and the flush conduit may be used to clean, or "flush," the feed line from the Dewar flask to the specimen. In operation, feed valve 26 may be closed such that fluid does not flow onto the specimen or the stage during flushing. The pressurizing gas may flow into the Dewar flask at normal or elevated levels. Flush valve 36 may then be opened until the desired amount of the fluid has been evacuated from the Dewar flask and conduit 28. After flushing, the flush valve may be closed and system operation may return to normal (e.g., the feed valve may be opened if another specimen is to be cooled and measured, etc.). Flush valve 36 and flush conduit 38 may include any appropriate components known in the art. In addition, the values may be controlled as described above using any suitable device and/or method known in the art. The system shown in FIG. 3 may be further configured as described herein.

Figure 4:
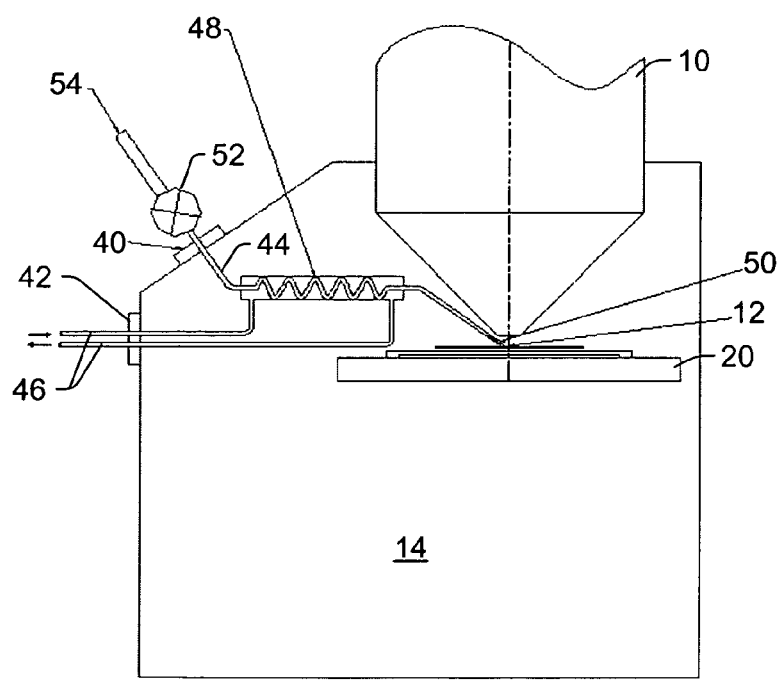

Another embodiment of a system configured to reduce distortion of a resist during a metrology process is shown in FIG. 4. Like the above described embodiment, this system includes electron column 10, which may be part of an electron beam metrology tool. The electron beam metrology tool is configured to measure one or more characteristics of one or more resist features (not shown) formed on specimen 12. The electron column and the electron beam metrology tool may be further configured as described herein. As shown in FIG. 4, at least the portion of the electron column proximate the specimen where the electrons exit the electron column is located in vacuum chamber 14. Specimen 12 is also located in vacuum chamber 14. The configuration of vacuum chamber 14 may vary depending on, for example, the configuration of the electron beam metrology tool.

In the embodiment shown in FIG. 4, the configuration of the vacuum chamber also depends on the configuration of the cooling subsystem. For instance, in this embodiment, the vacuum chamber is configured to accommodate vacuum feedthroughs 40 and 42. Vacuum feedthrough 40 couples conduit 44 to vacuum chamber 14 such that the conduit passes through the wall of the vacuum chamber without compromising the vacuum in the vacuum chamber. Vacuum feedthrough 42 couples liquid nitrogen feed lines 46 to vacuum chamber 14 such that the feed lines pass through the wall of the vacuum chamber without compromising the vacuum in the vacuum chamber. Vacuum feedthroughs 40 and 42, conduit 44, and liquid nitrogen feed lines 46 may include any appropriate components known in the art.

The liquid nitrogen feed lines are configured to flow liquid nitrogen into and out of cooling chamber 48 through which conduit 44 passes. Therefore, as one or more fluids pass through the portion of conduit 44 located in cooling chamber 48, the one or more fluids are cooled through standard heat transfer mechanisms. However, the one or more fluids may be cooled using any other methods or systems known in the art. The cooling chamber may have any cooling chamber configuration known in the art. As shown in FIG. 4, the cooling chamber may be located inside vacuum chamber 14. However, the cooling chamber may, alternatively, be located outside of the vacuum chamber.

Conduit 44 may also be configured to direct one or more fluids to an upper surface of specimen 12 (i.e. the surface of the specimen on which the resist feature(s) are formed) while the specimen is disposed on stage 20. The one or more fluids may include one of more gases, which may be delivered to the specimen as cooled gas jet 50. Stage 20 may be a thermally isolated stage and may be further configured as described herein. Conduit 44 may be coupled to a fluid reservoir (not shown) via valve 52 and conduit 54. Valve 52 and conduit 54 may include any suitable components known in the art.

The cooling subsystem is, therefore, coupled to the electron beam metrology tool. The cooling subsystem is configured to alter a temperature of the specimen during measurements by the electron beam metrology tool such that one or more resist features formed on the specimen are not substantially distorted during the measurements. In particular, the cooling subsystem may be configured to alter a temperature of the specimen before and/or during the measurements such that the temperature of the specimen during the measurements is maintained at an acceptable level. The temperature to which the specimen is cooled may be determined as described above.

In the above described embodiment, the cooling subsystem is configured to alter the temperature of the specimen using one or more fluids. In particular, the cooling subsystem may be configured to alter the temperature of a portion of the specimen using argon gas. However, it is to be understood that the cooling subsystem shown in FIG. 4 may be configured to alter the temperature of a portion of the specimen using any other appropriate fluid (e.g., helium or another noble gas). Preferably, the cooling subsystem is configured to cool the specimen using one or more fluids, which will not adversely affect the characteristics of the specimen and resist features formed on the specimen. For example, the one or more fluids used by the cooling subsystem are preferably substantially inert with respect to the specimen, the resist, and any other materials formed on the specimen. In addition, the fluid flow characteristics of the one or more fluids (e.g., flow rate, pressure, etc.) may be selected such that the one or more fluids do not adversely affect the characteristics of the specimen, the resist, and any other materials on the specimen.

The portion of the specimen that is cooled by the cooling subsystem may be determined based on the area of the specimen in which the measurements are to be performed. In particular, the cooling subsystem may be configured to cool at least the portion of the specimen that will be or is being measured. In this manner, the cooling subsystem may be configured for localized cooling of the specimen. The cooling subsystem may also be configured to cool substantially an entirety of the specimen substantially simultaneously. For example, the cooling subsystem may be configured such that the fluid exiting conduit 44 moves across a relatively large area of the specimen thereby cooling that relatively large area. In another example, the cooling subsystem may include more than one such conduit (coupled to one or more cooling chambers), each of which is configured to direct one or more fluids onto different portions of the specimen. Therefore, different portions of the specimen may be cooled independently. In addition, the different portions of the specimen may be cooled sequentially or simultaneously. In a further example, the cooling subsystem may be controllable such that the exit of conduit 44 may be positioned above different portions of the specimen. In this manner, the conduit may move above the specimen such that selected portion(s) of the specimen are cooled. As such, different portions of the specimen may be cooled in a sequential manner. The different portions that are cooled may include, for example, a portion of the specimen being measured and a portion of the specimen to be measured.

As shown in FIG. 4, the cooling subsystem is coupled to a measurement chamber of the electron beam metrology tool (i.e., vacuum chamber 14). In addition, since the cooling subsystem is configured to direct one or more fluids onto specimen 12 while it is disposed on stage 20, the cooling subsystem is effectively coupled to stage 20. However, it is to be understood that such a cooling subsystem may also be coupled to a load chamber (not shown) of the electron beam metrology tool. In addition, the system may include more than one such cooling subsystem, each coupled to a different chamber of the metrology tool. Alternatively, the system may include a cooling subsystem as shown in FIG. 4 coupled to the measurement chamber or the load chamber and a differently configured cooling subsystem (e.g., the cooling subsystem shown in FIG. 1, 2, or 3) coupled to the other chamber. In this manner, the system may include differently configured cooling subsystems, each of which is coupled to a different chamber of the metrology tool. The embodiment of the system shown in FIG. 4 may be further configured as described herein.

Figure 5:
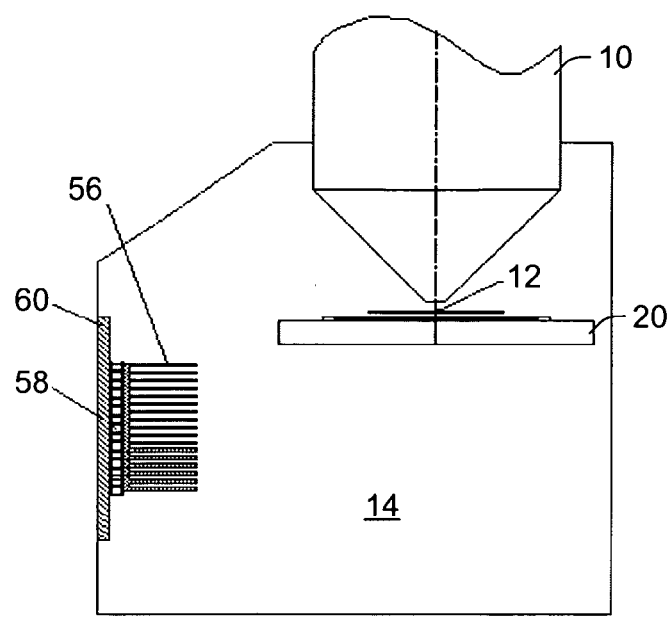

A different embodiment of a system configured to reduce distortion of a resist during a metrology process is shown in FIG. 5. Like the above described embodiments, this system includes electron column 10, which may be part of an electron beam metrology tool. The electron beam metrology tool is configured to measure one or more characteristics of one or more resist features (not shown) formed on specimen 12. The electron column and the electron beam metrology tool may be further configured as described herein. As shown in FIG. 5, at least the portion of the electron column proximate the specimen where the electrons exit the electron column is located in vacuum chamber 14. Specimen 12 is also located in vacuum chamber 14. The configuration of vacuum chamber 14 may vary depending on, for example, the configuration of the electron beam metrology tool.

The system also includes a cooling subsystem that is, as described above, configured to alter a temperature of the specimen during measurements by the electron beam metrology tool such that the one or more resist features are not substantially distorted during the measurements. In this embodiment, the cooling subsystem is configured as a condenser. The condenser is cooled by a Peltier cooling element. In particular, as shown in FIG. 5, the cooling subsystem may include condenser surface 56. Condenser surface 56 may include any suitable surface known in the art. The condenser surface is configured to absorb heat in the vacuum chamber. The condenser also includes Peltier cooling element 58 coupled to condenser surface 56. Peltier cooling element 58 is configured to absorb heat from condenser surface 56. In addition, Peltier cooling element 58 is coupled to copper heatsink 60. Copper heatsink 60 is configured to absorb heat from Peltier cooling element 58. Peltier cooling element 58 may be further configured as described above. In addition, copper heatsink 60 may have any suitable configuration known in the art and may be replaced with any other suitable heatsink known in the art.

Furthermore, as shown in FIG. 5, copper heatsink 60 may be coupled to an interior wall of vacuum chamber 14. Although the condenser is shown to be positioned at one particular location on one interior wall of the vacuum chamber, it is to be understood that the condenser may be coupled to any interior surface of the vacuum chamber in any suitable location. Moreover, the cooling subsystem may include more than one condenser which may be placed at different locations within the vacuum chamber. In this manner, the cooling subsystem may include one or more condensers that are coupled to a measurement chamber (i.e., vacuum chamber 14) of the system.

Since the condenser is configured to remove heat from the interior of the vacuum chamber, the condenser will also remove heat from the specimen located in the vacuum chamber. As such, the condenser may be configured to provide "global" cooling for the specimen. In this manner, the cooling subsystem may be configured to alter the temperature of substantially an entirety of the specimen substantially simultaneously. The temperature to which the specimen is cooled by this cooling subsystem may be determined as described above.

Although the cooling subsystem is shown in FIG. 5 to be located in a measurement chamber of the electron beam metrology tool, it is to be understood that such a cooling subsystem may also be coupled to a load chamber (not shown) of the electron beam metrology tool. In addition, the system may include more than one such cooling subsystem, each coupled to a different chamber of the metrology tool. Alternatively, the system may include a cooling subsystem as shown in FIG. 5 coupled to the measurement chamber or the load chamber and a differently configured cooling subsystem (e.g., the cooling subsystem shown in FIGS. 1-4) coupled to the other chamber. In this manner, the system may include differently configured cooling subsystems, each of which is coupled to a different chamber of the metrology tool. The embodiment of the system shown in FIG. 5 may be further configured as described herein.

Figure 6:
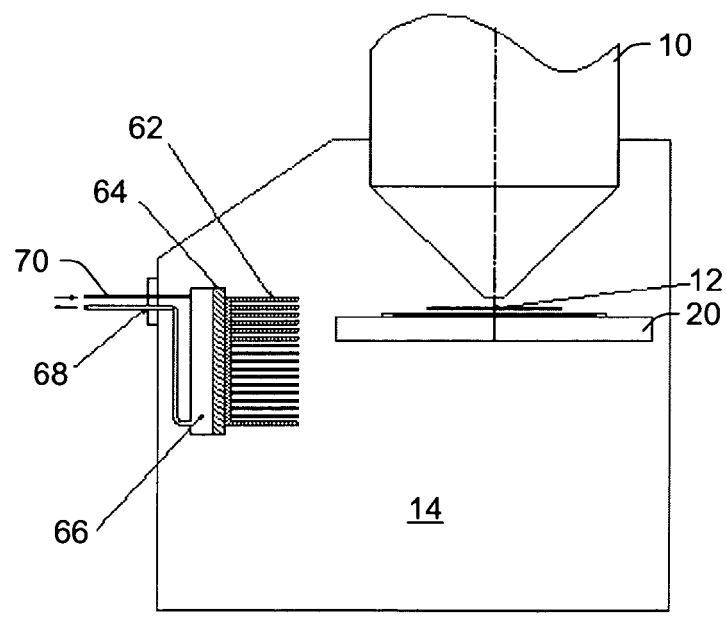

Another embodiment of a system configured to reduce distortion of a resist during a metrology process is shown in FIG. 6. Like the above described embodiments, this system includes electron column 10, which may be part of an electron beam metrology tool. The electron column and the electron beam metrology tool may be further configured as described herein. As shown in FIG. 6, at least the portion of the electron column proximate the specimen where the electrons exit the electron column is located in vacuum chamber 14. Specimen 12 is also located in vacuum chamber 14. The configuration of vacuum chamber 14 may vary depending on, for example, the configuration of the electron beam metrology tool.

The system also includes a cooling subsystem that is, as described above, configured to alter a temperature of the specimen during measurements by the electron beam metrology tool such that one or more resist features (not shown) formed on specimen 12 are not substantially distorted during the measurements. In this embodiment, the cooling subsystem is configured as a condenser. The condenser is configured as a liquid nitrogen cooled condenser. In particular, as shown in FIG. 6, the cooling subsystem may include condenser surface 62. Condenser surface 62 may include any suitable surface known in the art. The condenser surface is configured to absorb heat in the vacuum chamber. The condenser also includes copper heatsink 64 coupled to condenser surface 62. Copper heatsink 64 is configured to absorb heat from condenser surface 62. The copper heatsink may have any suitable configuration known in the art and may be replaced with any other suitable heatsink known in the art. In addition, liquid nitrogen cooling chamber 66 is coupled to copper heatsink 64. Liquid nitrogen cooling chamber 66 is configured to absorb heat from copper heatsink 64.

Liquid nitrogen cooling chamber may be coupled to vacuum chamber 14 by vacuum feedthrough 68. In this manner, the liquid nitrogen may be contained outside of the vacuum chamber in a containment vessel (not shown) such as that described above and may be moved into and out of liquid nitrogen cooling chamber 66 by liquid nitrogen feed lines 70. Although the condenser shown in FIG. 6 is shown to include a liquid nitrogen cooling subsystem coupled to heatsink 64, it is to be understood that a different fluid or fluids may be used in a similar manner with feed lines and a cooling chamber. Appropriate fluid(s) for the condenser may vary depending on, for example, the amount of heat being removed from the vacuum chamber. Liquid nitrogen cooling chamber 66, vacuum feedthrough 68, and liquid nitrogen feed lines 70 may include any suitable components known in the art.

As shown in FIG. 6, the condenser is located proximate an interior wall of vacuum chamber 14. Although the condenser is shown positioned in one particular location near one interior wall of the vacuum chamber, it is to be understood that the condenser may be arranged at any location within the vacuum chamber. Moreover, the cooling subsystem may include more than one such condenser, which may be placed at different locations within the vacuum chamber. In this manner, the cooling subsystem may include one or more condensers that are coupled to a measurement chamber (i.e., vacuum chamber 14) of the system.

Since the condenser is configured to remove heat from the interior of the vacuum chamber, the condenser will also remove heat from the specimen located in the vacuum chamber. As such, the condenser may be configured to provide "global" cooling for the specimen. In this manner, the cooling subsystem may be configured to alter the temperature of substantially an entirety of the specimen substantially simultaneously. The temperature to which the specimen is cooled by this cooling subsystem may be determined as described above.

Although the cooling subsystem is shown in FIG. 6 to be located in a measurement chamber of the electron beam metrology tool, it is to be understood that such a cooling subsystem may also be coupled to a load chamber (not shown) of the electron beam metrology tool. In this manner, the system may include more than one such cooling subsystem, each coupled to a different chamber of the metrology tool. Alternatively, the system may include a cooling subsystem as shown in FIG. 6 coupled to the measurement chamber or the load chamber and a differently configured cooling subsystem (e.g., the cooling subsystems shown in FIGS. 1-5) coupled to the other chamber. In this manner, the system may include differently configured cooling subsystems, each of which is coupled to a different chamber of the metrology tool. The embodiment of the system shown in FIG. 6 may be further configured as described herein.

The systems described above, therefore, include a cooling subsystem that is configured to remove heat from a specimen. The operation of at least some of the cooling subsystems may be reversed, however, such that the cooling subsystems instead function as drying subsystems. The drying subsystems are configured to reduce moisture proximate the specimen during measurements by the electron beam metrology tool such that the one or more resist features are not substantially distorted during the measurements.

For instance, the cooling subsystem shown in FIG. 1 may be replaced with a "hot plate" that is configured to heat substantially an entirety of the specimen substantially simultaneously to reduce the moisture proximate the specimen. The temperature of the specimen may be moderately increased by the drying subsystem. Alternatively, the hot plate may include a number of discrete heating elements positioned such that different portions of the specimen may be heated independently. The different portions of the specimen may be heated sequentially or simultaneously. The different portions may include a portion of the specimen being measured and a portion of the specimen to be measured. Therefore, the portion that is heated may be determined based on an area of the specimen in which the measurements are to be performed.

Reducing the moisture proximate the specimen before and/or during measurements by the electron beam metrology tool such that the moisture that is present proximate the specimen during the measurements is reduced, or even substantially eliminated, will reduce distortion of resist features on the specimen during the measurements. As described above, the term "moisture proximate the specimen" is generally defined as moisture that is present on a surface of the specimen (e.g., adsorbed on a surface of the specimen). However, this term may also be defined as moisture that is present in the specimen (e.g., within a layer formed on the specimen). Generally, the moisture that is present on a surface of the specimen or in the specimen may be moisture that is accumulated on the specimen due to handling of the specimen in a clean room environment. Such moisture may be commonly referred to as "native moisture."

In general, therefore, a system configured to reduce distortion of a resist during a metrology process includes an electron beam metrology tool that is configured to measure one or more characteristics of one or more resist features formed on a specimen. The system also includes a drying subsystem coupled to the electron beam metrology tool. The drying subsystem is configured to reduce moisture proximate the specimen during measurements by the electron beam metrology tool such that the one or more resist features are not substantially distorted during the measurements.

Figure 7:
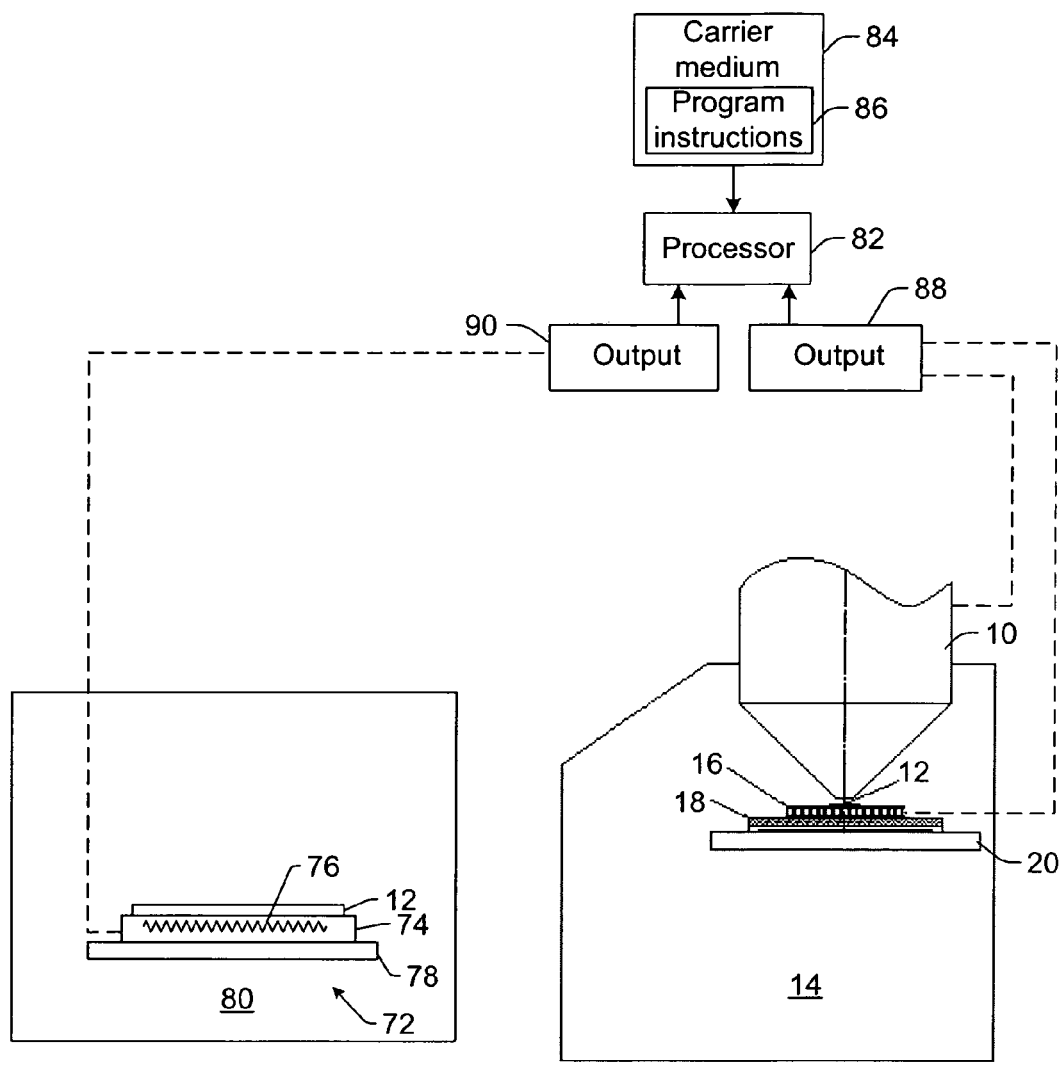

One embodiment of a system that includes a drying subsystem is illustrated in FIG. 7. In this embodiment, the drying subsystem performs a bulk heating operation to remove moisture from a specimen. In this manner, the drying subsystem is configured to reduce the moisture by heating substantially an entirety of the specimen substantially simultaneously. In one embodiment, drying subsystem 72 includes stage 74 that includes heating element 76. Stage 74 may include any appropriate stage known in the art. Heat generated by heating element 76 is conducted through stage 74 into specimen 12 thereby providing heat that can vaporize any moisture that might be proximate the specimen. In a similar manner, stage 74 may include a number of discrete heating elements (not shown) that are located in different positions throughout the stage. Heating element 76 and the discrete heating elements may include any suitable heating elements known in the art. In this manner, instead of providing global heating of the specimen, the drying subsystem may provide localized heating of the specimen. As such, the drying subsystem may be configured to reduce the moisture by heating a portion of the specimen. The portion of the specimen that is heated may be determined based on an area in which the measurements are to be performed. Heat exchanger 78 coupled to stage 74 captures excess heat from heating element 76 thereby minimizing undesirable heating of the drying subsystem itself and the surrounding environment. Heating exchanger 78 may include any suitable heat exchanger known in the art.

The drying subsystem shown in FIG. 7 is located in load chamber 80 of the system. The load chamber may be configured as a vacuum chamber. In this manner, any moisture removed from the specimen could be removed by the vacuum subsystem (not shown) coupled to load chamber 80. In another embodiment, the moisture that is evaporated from the specimen due to heating by the drying subsystem may be collected using a moisture getter assembly (not shown). The drying subsystem may include any suitable moisture getter assembly known in the art. In a different embodiment, the vacuum subsystem that is coupled to the load chamber or the measurement chamber may be modified or operated differently to reduce the moisture proximate the specimen. For example, the level of vacuum that is generated in the load chamber or measurement chamber may be increased to cause desorption of the moisture from the specimen with the vacuum.

In addition, specimen 12 may be moved from load chamber 80 to vacuum chamber 14, which as shown in FIG. 7 may be configured as a measurement chamber of an electron beam metrology tool. As shown in FIG. 7, the system includes a cooling subsystem configured as shown in FIG. 1 located in vacuum chamber 14. Therefore, in some embodiments, a system configured to reduce distortion of a resist during a metrology process may include a cooling subsystem and a drying subsystem. The cooling subsystem and the drying subsystem may be configured according to any of the embodiments described herein.

Although the measurement chamber of FIG. 7 includes a cooling subsystem as shown in FIG. 1, it is to be understood that the cooling subsystem included in the system of FIG. 7 may include any of the embodiments of the cooling subsystem described and illustrated herein. Furthermore, although the drying subsystem is shown in FIG. 7 to be located in a load chamber of the system, it is to be understood that this embodiment and any other appropriate drying subsystem may be located in the measurement chamber of the system. For example, the cooling subsystem shown in the measurement chamber of FIG. 7 may be replaced with the drying subsystem shown in the load chamber of FIG. 7.

In addition, the system shown in FIG. 7 may include one drying subsystem in the load chamber and one drying subsystem in the measurement chamber. In this manner, the system may include more than one drying subsystem, each coupled to a different chamber of the metrology tool. The drying subsystem in each chamber may be configured similarly or differently. The embodiment of the system shown in FIG. 7 may be further configured as described herein.

Another embodiment relates to a method for reducing distortion of a resist during a metrology process. The method includes altering a temperature of a specimen before and/or during measurements by an electron beam metrology tool such that one or more resist features on the specimen are not substantially distorted during the measurements. The method may also include measuring one or more characteristics of the one or more resist features formed on the specimen using the electron beam metrology tool. In one embodiment, the electron beam metrology tool may be configured as a SEM. In another embodiment, the resist is designed for exposure at a wavelength of about 193 nm or at a wavelength less than about 193 nm.

In some embodiments, altering the temperature of the specimen may include altering the temperature of substantially an entirety of the specimen substantially simultaneously. In a different embodiment, altering the temperature of the specimen may include altering the temperature of a portion of the specimen. The portion may be determined based on an area of the specimen in which the measurements are to be performed. In another embodiment, the temperature of the specimen may be altered while the specimen is disposed in a load chamber of the electron beam metrology tool. Each of the embodiments of the method described above may include any other step(s) described herein.

Yet another embodiment relates to a different method for reducing distortion of a resist during a metrology process. This method includes reducing moisture proximate a specimen during measurements by an electron beam metrology tool such that one or more resist features on the specimen are not substantially distorted during measurements. The method may also include measuring one or more characteristics of the one or more resist features formed on the specimen using the electron beam metrology tool. In one embodiment, the electron beam metrology tool may be configured as a SEM. In another embodiment, the resist is designed for exposure at a wavelength of about 193 nm or at a wavelength less than about 193 nm.

In one embodiment, reducing the moisture proximate the specimen may include reducing the moisture by heating substantially an entirety of the specimen substantially simultaneously. In a different embodiment, reducing the moisture may include reducing the moisture by heating a portion of the specimen. In some embodiments, reducing the moisture may include reducing the moisture by heating the specimen to evaporate the moisture from the specimen and collecting the moisture using a moisture getter assembly. In other embodiments, reducing the moisture proximate the specimen may include reducing the moisture by causing desorption of the moisture from the specimen with a vacuum. Each of the embodiments of the method described above may include any additional step(s) described herein.

A further embodiment relates to another method for reducing distortion of a resist during a metrology process. This method includes altering a temperature of a specimen during measurements by an electron beam metrology tool such that one or more resist features on the specimen are not substantially distorted during the measurements. This method also includes reducing moisture proximate the specimen during measurements by the electron beam metrology tool such that the one or more resist features are not substantially distorted during the measurements. This method may also include measuring one or more characteristics of the one or more resist features formed on the specimen. This embodiment may also include any additional step(s) described herein.

FIGS. 1-7 illustrate embodiments of a system that can be used to perform one or more of the methods described herein. As further shown in FIG. 7, the system may include processor 82. The processor may include any suitable processor known in the art. For example, the processor may be an image computer or a parallel processor. The system also includes carrier medium 84. Carrier medium 84 includes program instructions 86, which are executable on processor 82. The program instructions may be executable for performing any of the embodiments of the methods described above. The program instructions may be further configured as described above.

One or more components of the electron beam metrology tool may be coupled to processor 82 by a transmission medium (not shown). The transmission medium may include "wired" and "wireless" portions and may include any suitable transmission medium known in the art. For example, detectors (not shown) located in electron column 10 of the metrology tool may be configured to generate output 88. The detectors may include any appropriate detectors known in the art. The output may be transmitted across a transmission medium from the detectors to processor 82. In addition, Peltier cooling element or another portion of the cooling subsystem may produce output signals which may be transmitted to processor 82 as output 88. In some embodiments, the output may be transmitted through one or more electronic components (e.g., analog-to-digital converters) coupled between the detectors or the Peltier cooling element and the processor. In addition, the processor may transmit instructions across the transmission medium to one or more components of the cooling subsystem. For example, the processor may transmit the amount of cooling to be performed by the cooling subsystem depending on one or more characteristics of the specimen to be measured and/or one or more parameters of the electron column that will be used for the measurements. Alternatively, the processor may be configured to alter and control one or more parameters of the cooling subsystem.

In a similar manner, stage 74 or another portion of the drying subsystem may produce output signals which may be transmitted to processor 82 as output 90. In some embodiments, the output may be transmitted through one or more electronic components coupled between the stage and the processor. In addition, the processor may transmit instructions across the transmission medium to one or more components of the drying subsystem. For example, the processor may transmit the amount of heating to be performed by the drying subsystem depending on one or more characteristics of the specimen to be measured and/or one or more parameters of the electron column that will be used for the measurements. Alternatively, the processor may be configured to alter and control one or more parameters of the drying subsystem.

Therefore, output 88 and 90 is transmitted from various subsystems and the metrology tool to the processor. Output 88 and 90 may include metrology data and any other signals that are produced by various components of drying subsystem(s) and/or cooling subsystem(s) included in the system. Program instructions 86 may be executable on the processor to perform one or more computer-implemented methods using output 88 and/or 90.

Program instructions implementing methods such as those described herein may be transmitted over or stored on a carrier medium. The carrier medium may be a transmission medium such as a wire, cable, or wireless transmission link. The carrier medium may also be a storage medium such as a read-only memory, a random access memory, a magnetic or optical disk, or a magnetic tape.

In an embodiment, a processor may be configured to execute the program instructions to perform a computer-implemented method according to the above embodiments. The processor may take various forms, including a personal computer system, mainframe computer system, workstation, network appliance, Internet appliance, or other device. In general, the term "computer system" may be broadly defined to encompass any device having one or more processors, which executes instructions from a memory medium.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), or other technologies or methodologies, as desired.

Resist shrinkage may be caused by at least three individual processes. One possible process that may cause resist shrinkage is electron beam induced breakdown of the resist into volatile materials (e.g., hydrogen ($H_2$), methane ($CH_4$), etc.). When such volatile materials leave the resist, the dimensions of the resist may decrease. Such processes do not involve reactants other than the reactants included in the resist. Another possible process that may contribute to resist shrinkage is electron beam induced cross-linking of the resist. For example, high energy electrons may interact with the resist to produce free radicals that may then react with the resist material thereby crosslinking the resist material and increasing the density of the resist. Like the process described above, this reaction does not involve reactants other than the reactants included in the resist. In this manner, the above-described processes that may contribute to resist shrinkage may not be reduced or eliminated except by changing the composition of the resist or altering the characteristics of the charged particle beam. Obviously, changing the composition of the resist, other than to improve the lithographic performance of the resist, is undesirable. Also, alteration of the characteristics of the charged particle beam, such as reduction of landing energy or beam current, may be limited by signal to noise requirements of the measurement system.

Another process that may cause resist shrinkage is electron beam induced ionization of a resist or of contaminants such as water molecules present on the surface of the resist or embedded in the resist. Such reactions may produce volatile products that leave the resist thereby reducing the resist volume and dimensions. An example of such a reaction may be: 2C+2H$_2$O+(2 or more electron beam induced ionization steps)→CH$_4$+CO$_2$ (note that the hydrogen component of the resist has not been shown in this reaction). However, any number of variations of this reaction example are possible. Reactants may (and probably do) include various carbon and/or hydrogen containing molecules that may vary depending on, for example, the composition of the resist. Reaction products may (and may likely) include alcohols (ROH), esters (ROOCH$_3$), ethers (ROR), etc. The systems and methods described further herein may be used to reduce this process and therefore reduce resist shrinkage.

Figure 8:
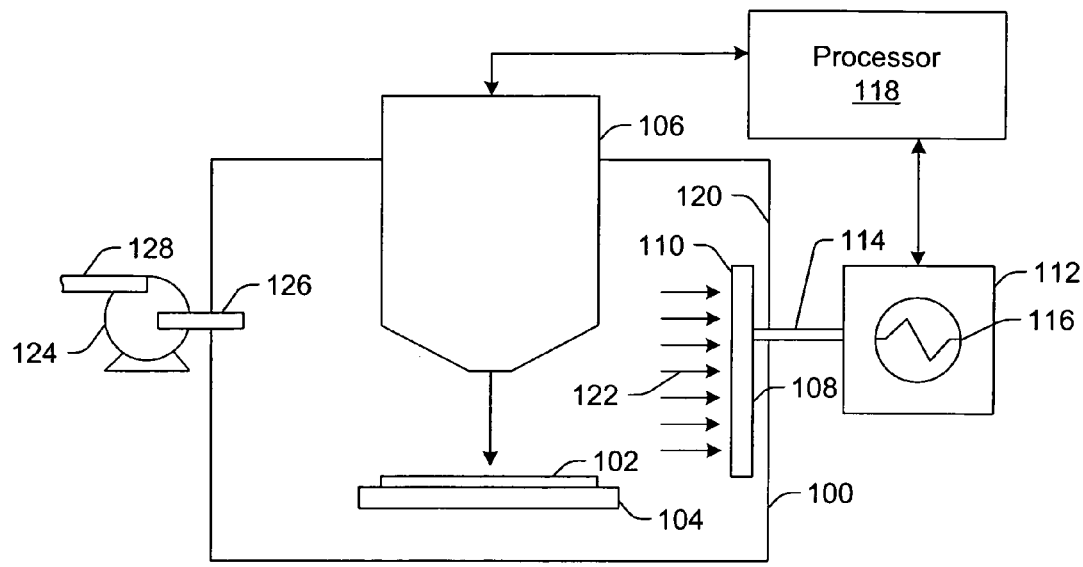
FIGS. 8-10 are schematic diagrams illustrating side views of different embodiments of a system configured to reduce alteration of a specimen during analysis and to analyze the specimen.

FIG. 8 illustrates one embodiment of a system configured to reduce alteration of a specimen during analysis. The system includes vacuum chamber 100 in which specimen 102 is disposed during the analysis. Specimen 102 may be disposed on stage 104 within vacuum chamber 100 during the analysis. Stage 104 may include any suitable mechanical and/or robotic assembly known in the art. As shown in FIG. 8, specimen 102 and stage 104 may be wholly contained within vacuum chamber 100 during the analysis. Vacuum chamber 100 may include any suitable vacuum chamber known in the art. In particular, vacuum chamber 100 may include any vacuum chamber that is suitable for use with a charged particle beam based tool such as a charged particle beam based tool configured to perform inspection, metrology, analysis such as composition analysis, defect review, or some combination thereof of specimen 102. In addition, vacuum chamber 100 may include any vacuum chamber that is suitable for use with any other tools described herein.

Although embodiments are described herein with respect to electron beam based tools, it is to be understood that the charged particle beam based tools may be non-electron beam tools such as ion beam based tools. One such ion beam based tool is a focused ion beam (FIB) tool that may be used for metrology, analysis, repair, or some combination thereof of a specimen. Another such ion beam based tool is a secondary ion mass spectroscopy (SIMS) tool that can be used for analysis of a specimen (e.g., to determine a concentration of an element in a structure formed on the specimen).

The embodiments of an analysis subsystem described herein may also be configured to perform any surface measurement process that involves the direct or incidental impingement or ejection of electrons or ions, that can cause undesirable reactions with reactants such as water molecules within the chamber, which can in turn cause shrinkage of resist structure(s). One example of such a system is an electron beam based etch system configured to use the electron beam to catalyze etching of a resist feature (e.g., to expose a cross-section of the resist feature). Greater control over the sample surface chemistry and chamber environment provided by the embodiments described herein will allow for improved etching and less collateral shrinkage. In another embodiment, the analysis subsystem is configured to analyze the specimen using incident x-rays. Examples of analysis subsystems that may be included in the systems described herein include analysis subsystems that may be configured to perform one or more processes such as, but not limited to, low energy electron diffraction (LEED) spectroscopy, low energy electron microscopy (LEEM), X-ray photoelectron spectroscopy (XPS), X-ray fluorescence spectroscopy (XFS), Auger electron spectroscopy (AES), or some combination thereof. In a further embodiment, the analysis subsystem is configured to analyze the specimen using incident electrons and detected x-rays. One example of such an analysis subsystem that may be included in the systems described herein includes electron probe micro analysis (EPMA) subsystems. In addition, the system may include more than one analysis subsystem, each of which is configured differently of some of which are configured substantially similarly. More than one analysis subsystem may be arranged in one vacuum chamber. Alternatively, each analysis subsystem may be arranged in different vacuum chambers is a cluster tool-like configuration.

The system may also include electron column 106. The electron column generally functions to focus electrons (not shown) on specimen 102. Electron column 106 may form part of an analysis subsystem of the system shown in FIG. 8. The analysis subsystem is configured to analyze specimen 102 while the specimen is disposed in vacuum chamber 100. In one embodiment, therefore, the analysis subsystem includes a charged particle beam subsystem. In this manner, the system shown in FIG. 8 may be configured to analyze specimen 102. For example, the system may be configured to inspect specimen 102, to measure one or more characteristics of specimen 102 by metrology or analysis, to review defects on specimen 102, or some combination thereof. As such, the analysis subsystem may be configured as an inspection subsystem, a metrology subsystem, an inspection and metrology subsystem, a defect review subsystem, etc. In this manner, the system shown in FIG. 8 may be configured as an inspection tool, a metrology tool, an analysis tool, a defect review tool, or some combination thereof. As shown in FIG. 8, at least the portion of the electron column proximate the specimen where the electrons exit the electron column is located in vacuum chamber 100. As further shown in FIG. 8, the entire electron column may not be located in vacuum chamber 100.

Electron column 106 may have any suitable configuration known in the art. For example, the electron column may be configured such that the analysis subsystem is configured as a SEM, a secondary emission electron microscope, or another electron beam based metrology tool. In addition, the electron column configuration may be suitable for metrology and/or other functions described above. The electron column may also have a configuration similar to that of electron columns included in SEM based systems that are commercially available from, for example, Applied Materials and KLA-Tencor. Examples of SEM based systems that are available from KLA-Tencor include the 8250, 8250-R, 8450, eCD-1, and eCD-x systems.

The system also includes element 108 disposed within vacuum chamber 100. Surface 110 of element 108 is cooled such that molecules (not shown) in vacuum chamber 100 are adsorbed onto the surface. The molecules may include water molecules such as water vapor. The molecules that are adsorbed onto surface 110 may be selected by controlling the temperature of the surface. For example, the surface of element 108 may be low enough such that the selected molecules are at least partially solidified or at least partially crystallized ("frozen out"), which results in adsorption of the molecules onto the surface of element 108. In one particular example, when the molecules that are to be adsorbed onto surface 110 of element 108 include water molecules, surface 110 of element 108 may be cooled to a temperature between about 75 K and about 135 K such that other molecules such as nitrogen and oxygen molecules are not adsorbed onto the surface of the element. Obviously, the temperature of the surface of the element may vary depending on the molecules that are selected to be adsorbed onto the surface of the element and the volatility of these molecules.

It should be noted that although the system described above includes the cooled surface within the vacuum chamber, some degree of improvement for reducing shrinkage can be expected even if the cooled surface is placed in its own housing coupled to the chamber. Such a cooled surface may be in fluid communication with the vacuum chamber (e.g., via a conduit coupled between the cooled surface housing and the environment within the vacuum chamber). However, placing the cooled surface within the vacuum chamber will dramatically increase the pumping speed (i.e., adsorption rate) of water molecules within the chamber, and will therefore be that much more effective at reducing undesirable reactions induced by impinging or ejected electrons at the specimen surface. In this manner, a cooled surface located within a vacuum chamber is the preferred configuration of the system.

Surface 110 of element 108 may be cooled for a period of time (e.g., at least a few days) before analysis or another process described herein is performed in vacuum chamber 100. In this manner, the vacuum chamber may be "dried out" before analysis is performed on a specimen in vacuum chamber 100. After the period of time has elapsed, analysis may be carried out in vacuum chamber 100 as normal.

By maintaining the temperature of surface 110 of element 108 at about a temperature at which the molecules may be at least partially solidified, the molecules may be maintained on the surface of the element (e.g., during the entire process performed in vacuum chamber 100). In this manner, the molecules cannot cause reduction in a dimension of a resist structure (not shown) formed on the specimen during the analysis. The systems described herein, therefore, are configured to reduce resist shrinkage induced by electron beam exposure of resist structures during CD SEM measurements and other processes. In particular, adsorption of the molecules on the cooled surface inhibits reactions that may otherwise take place on the surface of a specimen exposed to direct or incidental impingement or ejection of electrons or ions in the vacuum chamber and that may change the dimensions of resist structures on the specimen.

The resist structures may include, for example, line structures, contact structures, via structures, trench structures, or any other structures that have some three-dimensional shape. The structures may also be formed of any resist described above. In addition, the dimension of the resist structures that is relatively constant across time due to the embodiments described herein may include a line width or any other cross-sectional dimension (e.g., a diameter) and a height.

The embodiments described herein can be used, therefore, to reduce, and even substantially eliminate, reduction in one or more dimensions of one or more resist structures formed on the specimen. In particular, shrinkage with successive dynamic measurements (e.g., performed after loading and unloading of the specimen) and successive static measurements (e.g., performed without unloading of the specimen) is greatly reduced. In this manner, a system configured as described herein (e.g., a system including a cryogenically cooled panel or other cooled surface that may be configured as described herein) to reduce shrinkage during a CD SEM measurement may advantageously increase the accuracy and precision of CD measurements performed by the CD SEM. The systems and methods described herein also advantageously reduce resist shrinkage without damaging the resist or any other materials on the specimen.

The molecules that are adsorbed by the cooled surface may include molecules from the specimen itself. Such molecules may include water adsorbed on the specimen surface and/or present in a material on the specimen such as a resist, which may serve as reactants during the analysis of the specimen. In addition, the molecules may include molecules such as water molecules from within the vacuum chamber. Such molecules in the vacuum chamber may result from insufficient pumping or removal of gases such as water vapor from vacuum chamber 100.

Element 108, therefore, is configured to freeze out water vapor from the chamber environment thereby reducing the equilibrium surface coverage of molecules on the specimen in the vacuum chamber during CD measurement by an electron beam. In other words, the adsorption of the molecules on the element reduces the redeposition of the molecules back onto the specimen. In this manner, the reactants described above may be present at much lower concentrations at the point on the specimen surface that is exposed to the charged particle beam during the analysis. In addition, by placing a cooled surface such as a cryogenically cooled surface inside of vacuum chamber 100, the effective water vapor pumping ("removal") can be much greater than that achievable by pumping with the turbo alone. In this manner, the cooled surface of element 108 greatly reduces the water partial pressure in the vacuum chamber.

Controlling molecules in a vacuum chamber using the systems described herein have a number of advantages over other systems and methods for reducing unwanted molecules from within a vacuum chamber during a process that involves either direct or incidental impinging or ejection of electrons or ions. In particular, compared to heating of a specimen, which can only remove molecules from the specimen itself, the systems described herein can adsorb molecules from both the specimen and from other sources within the vacuum chamber thereby resulting in more effective elimination of shrinkage. Furthermore, unlike heating processes after which the molecules may redeposit on the specimen, the embodiments described herein can control the molecules in the vacuum chamber during the entire analysis process thereby increasing the accuracy of the measurements in comparison to measurements performed after heating of the specimen.

In addition, in one embodiment, the surface of the element is cooled such that a temperature of the specimen is not substantially altered by the element. For example, the temperature of the surface of the element in combination with the configuration of the element and the location of the element with respect to the specimen may be selected such that the element itself does not effectuate a temperature change of the specimen. Eliminating shrinkage without altering a temperature of the specimen either by heating and/or cooling eliminates the time required for stabilization of specimen temperature, thereby improving system throughput, and advantageously reduces the potential for damage to the specimen by heating or cooling or sudden or drastic temperature changes.

As further shown in FIG. 8, element 108 may be coupled to cooling subsystem 112 via conduit 114. Although cooling subsystem 112 is shown in FIG. 8 to symbolically include heat exchanger 116, it is to be understood that the cooling subsystem may include any appropriate refrigeration unit and/or other components known in the art. In addition, the configuration of the cooling subsystem may be selected based on the temperatures to which surface 110 of element 108 is to be cooled. One example of an appropriate cooling subsystem/element combination is a cryogenically cooled panel. Examples of commercially available components that are particularly suitable for use as a cryogenically cooled panel in the systems described herein include onboard water pump model 1050 used as a refrigeration unit and compressor model 9600, both of which are commercially available from Helix Technology Corporation, Mansfield, Mass. The refrigeration unit may have a cooling capacity of about 80 W. The element may be formed as a relatively thick panel of copper. The panel may be coated with a material such as nickel to increase the optical reflectance of the panel and the non-reactivity of the panel. Conduit 114 may include any appropriate conduit and/or elements known in the art. As shown in FIG. 8, cooling subsystem 112 is disposed outside of vacuum chamber 100. Such placement of the cooling subsystem may be selected such that the size of the vacuum chamber does not have to be increased to accommodate the cooling subsystem.

Cooling subsystem 112 may, therefore, control the temperature of surface 110 of element 108. In addition, cooling subsystem 112 may be controlled by the system. In one such embodiment, processor 118 of the system may be configured to control cooling subsystem 112. Processor 118 may be configured to control cooling subsystem 112 such that the cooling subsystem operates during predetermined or selected times. For example, in one embodiment, the system is configured to control cooling subsystem 112 such that the surface of the element is not cooled during analysis of specimen 102. Such an embodiment may be advantageous if the cooling subsystem may cause vibration of one or more elements of the system. Since such vibration may adversely affect the measurements performed by the system, the cooling subsystem may be "turned off" during analysis. Such intermittent cooling of surface 110 of element 108 may be sufficient since while the cooling subsystem is not operating, the temperature increase of the surface of the element may not be significant enough to cause desorption of molecules from the surface of the element. In addition, the temperature to which surface 110 is cooled prior to analysis may be selected to account for variation in the temperature of the surface caused by turning off the cooling subsystem.

In another embodiment, the system is configured to control cooling subsystem 112 such that the surface of the element is cooled while the analysis subsystem of which electron column 106 forms at least a part is performing one or more pre-analysis functions. For example, prior to measurement of a line width of a structure on a specimen or another inspection, metrology, and/or analysis function, the analysis subsystem may perform one or more non-analysis operations such as calibration, specimen alignment, etc. In this manner, operation of the cooling subsystem may be confined by the system software to moments when vibration caused by the cooling subsystem is not critical such as when the wafer is being loaded, when optical pattern recognition for global alignment is being performed, when the stage is being moved, and when measurement site pattern recognition is being performed. Although these functions are preferably performed with high accuracy, the amount of vibration introduced by cooling subsystem 112 may not be significant enough to reduce the accuracy of the pre-analysis functions. In addition, such control of the cooling subsystem allows a sufficiently cold temperature of surface 110 to be maintained without blurring of the area exposed to the charged particle beam, which distorts results of the analysis subsystem such as CD measurement. Furthermore, the time during which the surface of element 108 is not cooled by cooling subsystem 112 (e.g., during inspection, measurement, or analysis of specimen 102) may be minimized, which may improve the performance of molecule adsorption.

Processor 118 may include any suitable processing device known in the art. In addition, processor 118 may be configured to control cooling subsystem 112 using any method and/or technique known in the art. Furthermore, processor 118 may be coupled to cooling subsystem 112 using any device and/or method known in the art. Processor 118 may also be configured to perform other functions. For example, processor 118 may be coupled to electron column 106. Processor 118 may be coupled to electron column 106 using any method and/or device known in the art. In addition, processor 118 may be coupled to electron column 106 such that the processor may control one or more functions of the electron column. Processor 118 may also be coupled to electron column 106 such that the processor may receive output from electron column 106. In this manner, processor 118 may be configured to perform one or more functions on the output of the electron column. The one or more functions performed by processor 118 on the output of the electron column may include any inspection, metrology, and/or analysis functions known in the art such as detecting defects, determining line width and/or other dimensions of structures on the specimen, determining a composition of one or more structures on the specimen using the output, one or more defect review functions, or some combination thereof.

Element 108 may be configured as a panel that is relatively flat with a relatively large surface area. However, the configuration of element 108 may vary depending on the desired molecular control of the element. For example, the surface area of the element may be selected based on the expected amount of molecules that will be adsorbed onto the surface of the element. One example of an appropriate surface area for element 108 is about 1.5 ft$^2$. In addition, the configuration of element 108 may vary depending on the configuration of vacuum chamber 100 and other elements disposed within the vacuum chamber. For example, the configuration of element 108 may be selected such that the element may be retrofitted into existing vacuum chambers without substantial reconfiguration of the system and/or adverse effects on the operation of the system.

As further shown in FIG. 8, element 108 is disposed along inner surface 120 of vacuum chamber 100. In this manner, element 108 may be placed along one surface of the vacuum chamber such that the element can draw water molecules from the specimen surface. Molecules within the vacuum chamber may generally follow paths 122 from within the vacuum chamber to surface 110 of element 108. Element 108 may or may not be attached to inner surface 120 of vacuum chamber 100. In addition, as shown in FIG. 8, the element may be spaced from inner surface 120 of vacuum chamber 100. Since the element is disposed along inner surface 120 of vacuum chamber 100, the element may be located outside of a measurement path of the analysis subsystem. The measurement path is generally located between the lowermost surface of electron column 106 and specimen 102. However, the element may be disposed in any other position described herein. For example, in some electron beam systems such as CD SEMs, the element may be positioned along a bottom inner surface of the vacuum chamber.

Although the system of FIG. 8 is shown to include one element, it is to be understood that the system may include more than one element. The elements may be positioned at substantially different locations within the vacuum chamber (e.g., along substantially opposite inner surfaces of the vacuum chamber or proximate known sources of molecules in the vacuum chamber). Alternatively, the elements may be positioned at approximately the same location within the vacuum chamber (e.g., along the same inner surface of the vacuum chamber and substantially adjacent to one another). Each of the elements may be coupled to different cooling subsystems. Alternatively, each of the elements may be coupled to the same cooling subsystem. Surfaces of the elements may be cooled to different temperatures or substantially the same temperature. In this manner, the system may include one or more elements located within an analysis chamber that may be similarly or differently configured.

In another embodiment, the system may also include one or more such elements located within a second load lock chamber (not shown) of the system. A load lock chamber is generally a chamber into which the specimen is placed before it is placed in the analysis chamber. The load lock chamber may have any configuration known in the art. The second or intermediate load lock chamber may be the chamber in which the specimen is positioned after removal from the first load lock chamber, but before being moved into the analysis chamber. By including one or more such elements in the second load lock chamber, molecules may be removed from the specimen and the second load lock chamber prior to introduction of the specimen into the analysis chamber. The elements located in the analysis chamber and the second load lock chamber may be similarly or differently configured. In addition, the elements located in the analysis chamber and the second load lock chamber may be coupled to the same cooling subsystem or different cooling subsystems.

The system shown in FIG. 8 may also include turbo pump 124 coupled to vacuum chamber 100. Turbo pump 124 may include any suitable pump known in the art. Turbo pump 124 is configured to remove one or more gases (not shown) from vacuum chamber 100 while specimen 102 is disposed in vacuum chamber 100. The one or more gases may include, for example, water vapor and/or other gases present in the vacuum chamber. In this manner, the system may be configured to control molecules in the vacuum chamber using a combination of turbo pumping and adsorption.

As further shown in FIG. 8, turbo pump 124 may be disposed outside of vacuum chamber 100 and may be configured to remove one or more gases from vacuum chamber 100 through conduit 126. The gas or gases removed by turbo pump 124 may be transferred from pump 124 through conduit 128 to one or more fluid transfer, collection, or processing components. Conduits 126 and 128 may have any suitable configuration known in the art. The system shown in FIG. 8 may be further configured as described herein.

Figure 9:
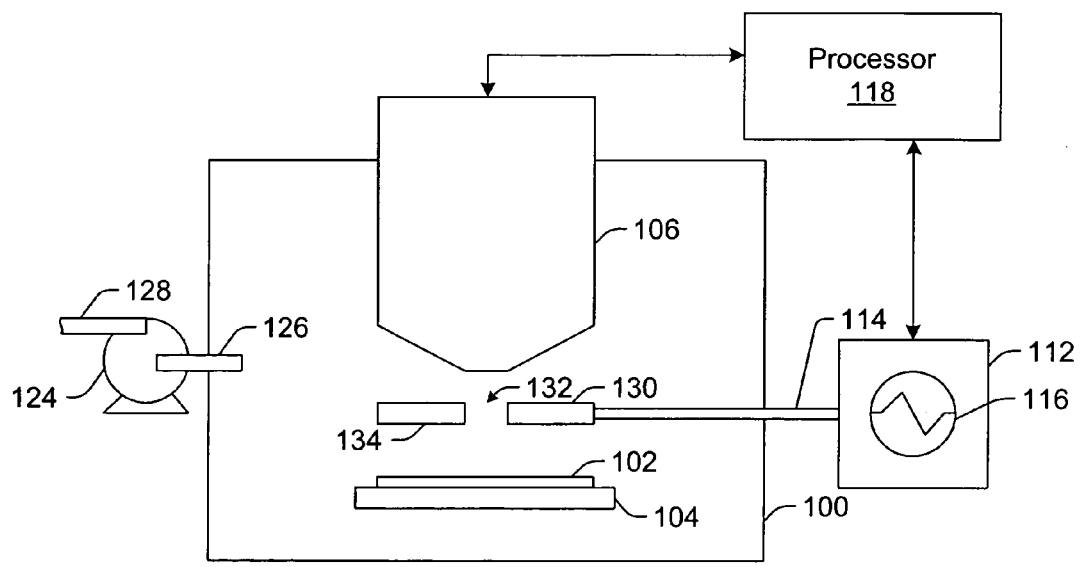

In another embodiment, the element described further above may be disposed above the specimen. One such embodiment is illustrated in FIG. 9. As shown in FIG. 9, element 130 may be disposed above specimen 102. In another embodiment, element 130 is disposed between specimen 102 and the analysis subsystem. In the embodiment shown in FIG. 9, element 130 is disposed between specimen 102 and electron column 106 that forms at least a part of the analysis subsystem. In one such embodiment, element 130 is configured such that a measurement path of the analysis subsystem passes through element 130. For example, element 130 may include opening 132 through which an electron beam may pass from electron column 106 to the specimen and from the specimen to one or more detectors of the analysis subsystem. Opening 132 may be at least as large as the cross-section of the charged particle beam of the analysis subsystem. In addition, opening 132 may be large enough to account for variation in the position of the charged particle beam such that element 130 does not interfere with the charged particle beam regardless of the position of the charged particle beam. Other than opening 132, element 130 may be a substantially continuous structure. However, element 130 may include more than one opening in some instances such as if the analysis subsystem includes multiple or non-coaxial measurement paths, if the analysis subsystem is configured to measure X-rays or some other part of the electromagnetic spectrum generated at the specimen due to interaction with the electron beam, or if other types of X-ray or electron detectors are included in the analysis subsystem depending on the measurement technique (LEED, LEEM, XPS, XFS, Auger, EPMA any other surface measurement spectroscopy, or some combination thereof) that the analysis subsystem is configured to perform.

As shown in FIG. 9, element 130 may be spaced from the upper surface of specimen 102. For example, the distance between element 130 and specimen 102 may be several cm. In addition, although element 130 is shown to be positioned relatively far from the upper surface of specimen 102 in FIG. 9, it is to be understood that the distance between the element and the specimen may vary. In some instances, it may be advantageous to position element 130 as close as possible to specimen 102 (obviously without contacting the specimen) such that the adsorption of potential reactants on or proximate to the specimen may be maximized. However, element 130 may also be positioned far enough away from specimen 102 such that the element does not alter the temperature of the specimen. Element 130 and all other elements of the system shown in FIG. 9 may be configured as described herein.

Positioning element 130 above specimen 102 may be advantageous in that the molecules from the specimen or proximate to the specimen that are adsorbed onto surface 134 of element 130 can travel a more direct path from specimen 102 to surface 134 than the path that the molecules travel from the specimen to surface 110 as shown in FIG. 8. In this manner, the system shown in FIG. 9 may provide more efficient collection of molecules from specimen 102 or proximate specimen 102 thereby further decreasing the effects of reactions between the molecules and the resist on the results of analysis performed on the specimen and on the characteristics of the specimen. The system shown in FIG. 9 may be further configured as described herein.

Figure 10:
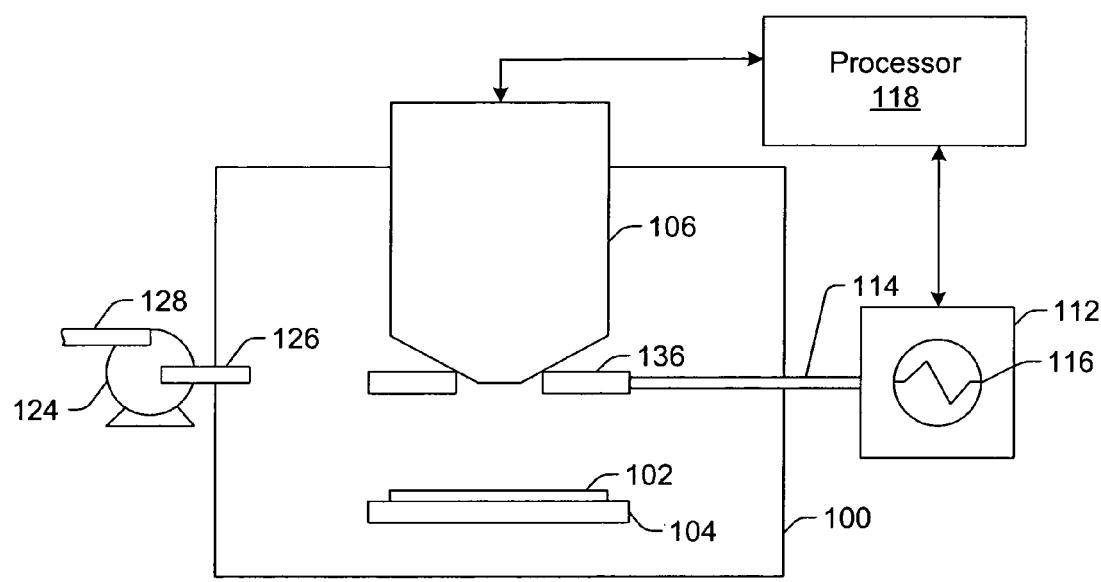

In the embodiment shown in FIG. 9, element 130 may be configured such that the element has substantially no effect either positive or negative on the charged particle beam of the analysis subsystem. In other embodiments, however, element 130 is coupled to or forms part of the analysis subsystem. For example, an element that would normally be included in the analysis subsystem may be configured to function as an element having a surface that is cooled such that molecules in the vacuum chamber are adsorbed onto the surface. In one such embodiment, which is shown in FIG. 10, element 136 may be configured as a field terminator or other system component such as a Wehnelt. A field terminator is not technically a part of an electron column. Instead, the electron column terminates at the last lens, and the field terminator is positioned around this lens. The field terminator may be coupled to the electron column to maintain the position of the field terminator with respect to the electron column. The field terminator generally functions to smooth the electric field incident on the surface of the specimen. In this manner, the element may have multiple functions: field terminating and molecule adsorption. Similarly, the Wehnelt plate which is placed below the objective lens may be cooled to also effect molecular adsorption near the surface of the sample.

Any other element that has a surface area suitable for adsorption of molecules and that performs a function that will not be altered by reconfiguration of the element for cooling may be reconfigured to function as an element as described further herein. For instance, although a field terminator may be advantageously reconfigured to adsorb molecules as described herein since it has a relatively large surface area (e.g., the field terminator may have a width of about 20 cm) that is substantially opposite to and above the surface of specimen 102, it is to be understood that any other element of the analysis subsystem or coupled to the analysis subsystem regardless of position within the vacuum chamber may be used to adsorb molecules as described further herein. For example, the Wehnelt plate may be used to adsorb molecules as described further herein. The Wehnelt plate differs from the field terminator in that the Wehnelt plate can be held at a non-zero potential. The system shown in FIG. 10 may be further configured as described herein.

Such increased reduction in shrinkage is illustrated in the CD SEM measurements shown in Table 1. In particular, Table 1 illustrates changes in CD measurements for different types of measurements that were performed with and without using a cooled surface to adsorb molecules in the vacuum chamber. The SEM used for these measurements is the eCD-2 system that is commercially available from KLA-Tencor. The features that were measured were lines formed of a resist designed for exposure at 193 nm. The cooled surface had a surface area of 1.5 ft² that was mounted in this example along the bottom of the chamber. In addition, the cooled surface was cooled to a temperature of 75 K.

TABLE 1

| Measurement Type | $\Delta$CD (nm) CP Off | $\Delta$CD (nm) CP On | $\Delta$CD (nm) (CP Off – CP On) | $\Delta$CD (%) (CP Off – CP On) |
|---|---|---|---|---|
| 600 Scan | 1.57 | 1.43 | 0.14 | 8.92 |
| 600 CD2D | 1.42 | 1.21 | 0.21 | 14.87 |
| 200 Scan | 0.94 | 0.72 | 0.22 | 23.73 |
| 200 CD2D | 0.69 | 0.17 | 0.51 | 74.72 |

In Table 1, 600 Scan indicates line scan type measurements that were performed with a landing energy of 600 eV. 600 CD2D indicates measurements that were performed using images that were acquired with a landing energy of 600 eV. In this manner, the CD2D measurements involve an image-based CD SEM technique as opposed to the traditional line scan technique. 200 Scan indicates line scan type measurements that were performed with a landing energy of 200 eV. 200 CD2D indicates measurements were also made using images, in this case using a 200V landing energy.

In Table 1, CP Off indicates measurements that were performed without using a cooled surface to adsorb molecules in the vacuum chamber. CP On indicates measurements that were performed using a cooled surface to adsorb molecules in the vacuum chamber. As shown by the values in Table 1, all of the measurements that were performed using a cooled surface to adsorb molecules in the vacuum chamber showed less shrinkage ($\Delta$CD) than the measurements that were performed without using a cooled surface to adsorb molecules in the vacuum chamber. As further shown by the values in Table 1, the reduction in shrinkage due to using the cooled surface to adsorb molecules in a vacuum chamber ($\Delta$CD (CP Off–CP On)) is substantial for all of the measurements that were performed. Therefore, using a cooled surface to adsorb molecules in a vacuum chamber reduces shrinkage and increases the accuracy and precision of CD SEM measurements performed using both CD SEM measurement techniques.

Such increased reduction in shrinkage is also illustrated in the AFM measurements shown in Table 2. In particular, Table 2 illustrates changes in CD measurements performed by an AFM before and after different types of measurements were performed with and without using a cooled surface to adsorb molecules in the vacuum chamber. The SEM used for these measurements is the eCD-2 system. The AFM used for these measurements is a Dimension 3100 Scanning Probe Microscope (SPM) that is commercially available from Veeco Instruments, Inc., Woodbury, N.Y. The resist features were lines having a width of about 100 nm and a thickness of about 300 nm. The resist is a resist designed for exposure at 193 nm. The cooled surface had a surface area of 1.5 ft² that was mounted in this example along the bottom of the chamber. In addition, the cooled surface was cooled to a temperature of 75 K.

TABLE 2

| Measurement Type | $\Delta$CD (nm) CP Off | $\Delta$CD (nm) CP On | $\Delta$CD (nm) (CP Off – CP On) | $\Delta$CD (%) (CP Off – CP On) |
|---|---|---|---|---|
| 600 Scan | 5.93 | 4.60 | 1.33 | 22.43 |
| 200 Scan | 3.09 | 1.57 | 1.52 | 49.19 |

The same notations are used in Tables 1 and 2. As shown by the values in Table 2, all of the measurements that were performed using a cooled surface to adsorb molecules in the vacuum chamber showed less shrinkage ($\Delta$CD) than the measurements that were performed without using a cooled surface to adsorb molecules in the vacuum chamber. As further shown by the values in Table 2, the reduction in shrinkage due to using the cooled surface to adsorb molecules in the vacuum chamber ($\Delta$CD (CP Off–CP On)) is substantial for all of the measurements that were performed. Therefore, using a cooled surface to adsorb molecules in a vacuum chamber reduces shrinkage and increases the accuracy and precision of CD SEM measurements performed using both CD SEM measurement techniques.

The embodiments described herein may use only one type of mechanism (e.g., a cooled surface) for substantially reducing alteration of a characteristic of a specimen. Using only one type of mechanism may be advantageous in that it provides a relatively simple system. In addition, since the mechanisms described herein are effective for substantially eliminating shrinkage or other alteration of a specimen characteristic, the mechanisms may be implemented without other specimen pre-treatment mechanisms for removing unwanted molecules from the specimen prior to analysis. Since such pre-treatment may reduce the throughput of the analysis process, the embodiments described herein may have a relatively high throughput while substantially eliminating shrinkage or other alteration of a characteristic of the specimen.

Reductions in shrinkage similar to those described herein may be achieved by pumping down (removing gases from) a system for an extended period of time (e.g., several weeks to several months). However, pumping down the analysis chamber of a system for such an extended period of time may be impractical and substantially expensive. Therefore, the systems and methods described herein provide significant advantages over other methods and systems for reducing shrinkage because the methods described herein can be performed in a substantially shorter period of time and are relatively inexpensive.

However, it is to be understood that the systems described herein may include or use one or more additional mechanisms to assist in reducing shrinkage. For example, the system may be configured to heat the specimen or to expose the specimen to a plasma, electromagnetic radiation (e.g., microwave, infrared, visible, or ultraviolet (UV) radiation), or dry gas bombardment prior to or during the analysis performed by the system. In one such example, the system may include a heating element disposed in one or more stages of the system. The stage(s) may include the stage configured to support the specimen in the load lock chamber and/or the stage configured to support the specimen in the analysis chamber. In another example, photon illumination (UV, visible, or infrared) of the entire specimen may be performed as a pre-treatment either in the analysis chamber or in the load lock chamber. Such pre-treatment may alternatively be performed only locally just at the analysis site or sites on the specimen. In addition, any other pre-treatment that can reduce a layer of water on the specimen or water in materials on the specimen can be used in the systems and methods described herein. Any other appropriate plasma or electromagnetic radiation source known in the art may be included in the systems described herein.

In another example, the system may be configured to perform increased pumping in the load lock chamber. In a further example, the system may include a three chamber configuration that includes two load lock chambers in addition to the analysis chamber. Increasing the pumping in the load lock chamber or increasing the number of load lock chambers may reduce the number of molecules that are introduced to the analysis chamber from the load lock chamber thereby reducing the overall number of molecules adsorbed onto the cooled surface.

As described above, the embodiments described herein may be configured to reduce the number of certain molecules that are present in a vacuum chamber by adsorbing them onto a cooled surface. In one such embodiment, the molecules may include water molecules thereby significantly reducing the water partial pressure inside the vacuum chamber. Such reduction in the water partial pressure may have a number of additional advantages. For example, by reducing the availability of water (and therefore available oxygen) in the vacuum chamber, the water (and available oxygen) in the electron column may also be reduced. Therefore, the amount of water molecules (and available oxygen) in the gun and proximate to the filament may also be reduced. As such, the availability of water and oxygen for attacking (etching) or reacting with the filament inside of an electron gun of the analysis subsystem will be reduced. In this manner, using a relatively large cryogenically cooled plate or other element described herein in an electron beam system may improve electron gun life. As a result, the embodiments described herein may be used to extend the lifetime of an electron gun of an analysis subsystem or other electron beam system such as an electron beam lithography system.

One embodiment, therefore, relates to a system configured to analyze a specimen that includes an analysis subsystem configured to analyze the specimen while the specimen is disposed in a vacuum chamber. The analysis subsystem includes a charged particle beam source. The charged particle beam source may include, for example, an electron gun. In addition, the system includes an element disposed within the vacuum chamber. A surface of the element is cooled such that molecules in the vacuum chamber are adsorbed onto the surface and cannot cause alteration of a characteristic of the charged particle beam source. This embodiment may be further configured as described herein.

As described above, therefore, the systems described herein are particularly advantageous for any analysis subsystem that uses an electron beam for the analysis of a specimen or any system in which derivation of a measurement involves the direct or incidental impingement or ejection of electrons or ions from the sample (XPS, AES, LEED, XFS, LEEM, etc.). These measurement techniques are substantially sensitive to the surface of the specimen. Therefore, the reduction of contamination or inhibition of electron or ion catalyzed surface reactions(s) is desirable in such applications. In particular, as described further above, the presence of a cooled surface (e.g., a cryogenically cooled surface) in the vacuum chamber of an electron beam based tool inhibits any electron beam initiated reactions at the surface of the specimen, which involve the participation of a reactant present in the chamber environment. The reactant or reactants may originate either from the specimen or the system and may have a significant volatility at room temperature and a reduced volatility at the temperature of the cooled surface. An example of such a material includes water (which resulted in shrinkage in the CD SEM).

The systems described herein, however, would also be beneficial for FIB etch tools and electron beam etch tools. In one embodiment, therefore, a system configured to process a specimen includes a charged particle beam subsystem configured to catalyze a process performed on the specimen while the specimen is disposed in a vacuum chamber. The system also includes an element disposed within the vacuum chamber. A surface of the element is cooled such that molecules in the vacuum chamber are adsorbed onto the surface and cannot alter the process being performed at a surface of the specimen. In one embodiment, the charged particle beam subsystem is configured as a FIB tool. In a different embodiment, the charged particle beam subsystem is configured as an electron beam tool. In a further embodiment, the process includes etch. Each of the system embodiments described above may be further configured as described herein.

Examples of charged particle beam subsystems configured to catalyze a process performed on a specimen while the specimen is disposed in a vacuum chamber are illustrated in U.S. patent application Ser. Nos. 11/082,039 by Soltz et al., filed Mar. 15, 2005 and 11/086,048 by Nasser-Ghodsi et al., filed Mar. 22, 2005, which are incorporated by reference as if fully set forth herein. The systems described herein may be further configured as described in these patent applications.

Accordingly, the systems described herein may be used in any application such as surface measurement, imaging, or any surface modification process in which reaction between water and resist is undesirable and the reduction of water from the interaction region on and near the sample surface is advantageous. In addition, the systems described herein may be used not only in vacuum or other low pressure chambers, but also in higher pressure chambers (i.e., non-vacuum chambers). As such, the systems described herein may be used as a highly efficient, low cost dessicant for use in chambers operated at any pressure. One such tool that may benefit from inclusion of an element described herein is an atomic force microscope (AFM) tool. Another such tool would be a scanning tunneling electron microscope (STM), or any other type of scanning probe imaging or measurement system, where surface reactions would distort the measurements being performed. The AFM and the STM may include any such microscopes known in the art.

In one embodiment, therefore, a system configured to analyze a specimen includes a scanning probe microscope configured to analyze the specimen while the specimen is disposed in an analysis chamber. The system also includes an element disposed within the analysis chamber. A surface of the element is cooled such that molecules in the analysis chamber are adsorbed onto the surface and cannot cause reduction in a dimension of a resist structure formed on the specimen during the analysis. In one embodiment, the scanning probe microscope is configured as an AFM or a STM. Each of these embodiments of the system may be further configured as described herein.

Another embodiment relates to a method for reducing alteration of a specimen during analysis. The method includes creating a vacuum in a chamber in which the specimen is disposed during the analysis. The method also includes cooling a surface of an element disposed in the chamber to cause molecules in the chamber to be adsorbed onto the surface such that the molecules cannot cause reduction in a dimension of a resist structure formed on the specimen during the analysis. The chamber in which the specimen is disposed may be configured as described further herein. In addition, the method may also be performed in a load lock chamber (e.g., the second of two load lock chambers into which the specimen is placed). The element may be configured as described further herein. In this manner, the method may be performed by any of the system embodiments described herein.

In one embodiment, cooling the surface of the element is not performed during the analysis. In another embodiment, cooling the surface of the element is performed during one or more pre-analysis functions that are performed while the specimen is in the chamber. In such an embodiment, cooling the surface of the element is not performed during the analysis. The cooling may be controlled as described further herein.

In one embodiment, the analysis includes inspection or metrology. In another embodiment, the analysis may include any surface based measurement in which removal of water or other potential reactants of an electron or ion catalyzed surface reaction during analysis will reduce surface reactions thereby improving the precision and/or accuracy of the measurement.

In one embodiment, a temperature of the specimen is not substantially altered by the cooling of the surface of the element. In some embodiments, the molecules include water vapor. Each of the embodiments of the method described above may include any other step(s) described herein.

Further modifications and alternative embodiments of various aspects of the invention may be apparent to those skilled in the art in view of this description. For example, systems configured to reduce distortion of a resist during a metrology process are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A system configured to reduce distortion of a resist during a metrology process, comprising:
   an electron beam metrology tool configured to measure one or more characteristics of one or more resist features formed on a specimen; and
   a cooling subsystem coupled to the electron beam metrology tool, wherein the cooling subsystem is configured to alter a temperature of the specimen during measurements by the electron beam metrology tool such that the one or more resist features are not substantially distorted during the measurements.

2. The system of claim 1, wherein the electron beam metrology tool is configured as a scanning electron microscope.

3. The system of claim 1, wherein the resist is designed for exposure at a wavelength of about 193 nm.

4. The system of claim 1, wherein the cooling subsystem is further configured to alter the temperature of substantially an entirety of the specimen substantially simultaneously.

5. The system of claim 1, wherein the cooling subsystem is further configured to alter the temperature of the specimen while the specimen is disposed in a load chamber of the electron beam metrology tool.

6. The system of claim 1, wherein the cooling subsystem is further coupled to a measurement chamber of the electron beam metrology tool.

7. The system of claim 1, wherein the cooling subsystem is further coupled to a stage located in a measurement chamber of the electron beam metrology tool.

8. The system of claim 1, wherein the cooling subsystem is further configured to alter the temperature of a portion of the specimen, and wherein the portion is determined based on an area of the specimen in which the measurements are to be performed.

9. The system of claim 1, wherein the cooling subsystem is further configured to alter the temperature of a portion of the specimen using one or more gases.

10. The system of claim 1, wherein the cooling subsystem is further configured to alter the temperature of a portion of the specimen using one or more gases, and wherein the one or more gases are cooled using liquid nitrogen.

11. The system of claim 1, wherein the cooling subsystem comprises a liquid nitrogen cooled condenser.

12. The system of claim 1, wherein the cooling subsystem is further configured to alter the temperature of a portion of the specimen using liquid nitrogen.

13. The system of claim 1, wherein the cooling subsystem comprises a Peltier cooling element coupled to a copper heatsink, wherein the copper heatsink is coupled to a thermally isolated stage, and wherein the specimen is disposed upon the Peltier cooling element during the measurements.

14. The system of claim 1, wherein the cooling subsystem comprises a condenser that is cooled by a Peltier cooling element.

15. A system configured to reduce distortion of a resist during a metrology process, comprising:
   an electron beam metrology tool configured to measure one or more characteristics of one or more resist features formed on a specimen; and
   a drying subsystem coupled to the electron beam metrology tool, wherein the drying subsystem is configured to reduce moisture proximate the specimen during measurements by the electron beam metrology tool such that the one or more resist features are not substantially distorted during the measurements.

16. The system of claim 15, wherein the drying subsystem is further configured to reduce the moisture by heating substantially an entirety of the specimen substantially simultaneously.

17. The system of claim 15, wherein the drying subsystem is further configured to reduce the moisture by heating a portion of the specimen.

18. The system of claim 15, wherein the drying subsystem is further configured to reduce the moisture by heating the specimen to evaporate the moisture from the specimen, and wherein the drying subsystem is further configured to collect the moisture using a moisture getter assembly.

19. The system of claim 15, wherein the drying subsystem is further configured to reduce the moisture by causing desorption of the moisture from the specimen with a vacuum.

20. The system of claim 15, wherein the drying subsystem is further coupled to a measurement chamber of the electron beam metrology tool.

21. A system configured to reduce distortion of a resist during a metrology process, comprising:
an electron beam metrology tool configured to measure one or more characteristics of one or more resist features formed on a specimen;
a cooling subsystem coupled to the electron beam metrology tool, wherein the cooling subsystem is configured to alter a temperature of the specimen during measurements by the electron beam metrology tool such that the one or more resist features are not substantially distorted during the measurements; and
a drying subsystem coupled to the electron beam metrology tool, wherein the drying subsystem is configured to reduce moisture proximate the specimen during measurements by the electron beam metrology tool such that the one or more resist features are not substantially distorted during the measurements.

22. A system configured to reduce alteration of a specimen during analysis, comprising:
a vacuum chamber in which the specimen is disposed during the analysis; and
an element disposed within the vacuum chamber, wherein a surface of the element is cooled such that molecules in the vacuum chamber are adsorbed onto the surface and cannot cause reduction in a dimension of a resist structure formed on the specimen during the analysis.

23. The system of claim 22, wherein the molecules comprise water vapor.

24. The system of claim 22, wherein the surface of the element is cooled such that a temperature of the specimen is not substantially altered by the element.

25. The system of claim 22, wherein the element is further disposed along an inner surface of the vacuum chamber.

26. The system of claim 22, wherein the element is further disposed above the specimen.

27. A system configured to analyze a specimen, comprising:
an analysis subsystem configured to analyze the specimen while the specimen is disposed in a vacuum chamber; and
an element disposed within the vacuum chamber, wherein a surface of the element is cooled such that molecules in the vacuum chamber are adsorbed onto the surface and cannot cause reduction in a dimension of a resist structure formed on the specimen during the analysis.

28. The system of claim 27, wherein the molecules comprise water vapor.

29. The system of claim 27, wherein the analysis subsystem comprises a charged particle beam based subsystem.

30. The system of claim 27, wherein the analysis subsystem is further configured to analyze the specimen using a technique that involves direct or incidental electron or ion ejection.

31. The system of claim 27, wherein the analysis subsystem is further configured to analyze the specimen using incident x-rays.

32. The system of claim 27, wherein the analysis subsystem is further configured as an inspection subsystem, a metrology subsystem, or an inspection and metrology subsystem.

33. The system of claim 27, wherein the system is further configured to control a cooling subsystem coupled to the element such that the surface of the element is not cooled during the analysis.

34. The system of claim 27, wherein the system is further configured to control a cooling subsystem coupled to the element such that the surface of the element is cooled while the analysis subsystem is performing one or more pre-analysis functions.

35. The system of claim 27, wherein the element is further disposed along an inner surface of the vacuum chamber and outside of a measurement path of the analysis subsystem.

36. The system of claim 27, wherein the element is further disposed between the specimen and the analysis subsystem, and wherein the element is configured such that a measurement path of the analysis subsystem passes through the element.

37. The system of claim 27, wherein the element is coupled to the analysis subsystem.

38. The system of claim 27, wherein the element is configured such that a temperature of the specimen is not substantially altered by the surface of the element.

39. A method for reducing alteration of a specimen during analysis, comprising:
creating a vacuum in a chamber in which the specimen is disposed during the analysis; and
cooling a surface of an element disposed in the chamber to cause molecules in the chamber to be adsorbed onto the surface such that the molecules cannot cause reduction in a dimension of a resist structure formed on the specimen during the analysis.

40. The method of claim 39, wherein said cooling is not performed during the analysis.

41. The method of claim 39, wherein said cooling is performed during one or more pre-analysis functions performed while the specimen is in the chamber, and wherein said cooling is not performed during the analysis.

42. The method of claim 39, wherein the analysis comprises inspection or metrology.

43. The method of claim 39, wherein a temperature of the specimen is not substantially altered by said cooling.

44. The method of claim 39, wherein the molecules comprise water vapor.

45. A system configured to analyze a specimen, comprising:
a scanning probe microscope configured to analyze the specimen while the specimen is disposed in an analysis chamber; and
an element disposed within the analysis chamber, wherein a surface of the element is cooled such that molecules in the analysis chamber are adsorbed onto the surface and cannot cause reduction in a dimension of a resist structure formed on the specimen during the analysis.

46. The system of claim 45, wherein the scanning probe microscope is configured as an atomic force microscope or a scanning tunneling electron microscope.

* * * * *